US010750610B2

(12) United States Patent
Paek et al.

(10) Patent No.: US 10,750,610 B2
(45) Date of Patent: Aug. 18, 2020

(54) PRINTED CIRCUIT BOARD AND STORAGE DEVICE INCLUDING PRINTED CIRCUIT BOARD

(71) Applicant: Samsung Electronics Co., Ltd., Suwon-si, Gyeonggi-do (KR)

(72) Inventors: Joon Ki Paek, Hwaseong-si (KR); KwangSoo Park, Suwon-si (KR); Heeju Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/245,345

(22) Filed: Jan. 11, 2019

(65) Prior Publication Data

US 2019/0373714 A1  Dec. 5, 2019

(30) Foreign Application Priority Data

May 29, 2018  (KR) .......................... 10-2018-0061301

(51) Int. Cl.
  *H05K 7/10* (2006.01)
  *H05K 7/12* (2006.01)
  *H05K 1/02* (2006.01)
  *H05K 1/18* (2006.01)
  *H01L 25/18* (2006.01)
(52) U.S. Cl.
  CPC .......... *H05K 1/0248* (2013.01); *H01L 25/18* (2013.01); *H05K 1/025* (2013.01); *H05K 1/181* (2013.01); *H05K 2201/09227* (2013.01); *H05K 2201/09254* (2013.01); *H05K 2201/10159* (2013.01)

(58) Field of Classification Search
  CPC ...... H01L 25/18; H05K 1/0248; H05K 1/025; H05K 1/181; H05K 2201/09227; H05K 2201/09254; H05K 2201/10159
  See application file for complete search history.

(56) References Cited

U.S. PATENT DOCUMENTS

| 6,927,992 | B1 | 8/2005 | Yen |
| 7,106,094 | B2 | 9/2006 | Gamble et al. |
| 7,245,145 | B2 * | 7/2007 | Pax ........................ G11C 5/025 326/30 |
| 8,279,690 | B1 * | 10/2012 | Wang .................. G06F 13/4234 365/191 |
| 9,811,266 | B1 * | 11/2017 | Sun ......................... G06F 3/061 |
| 2006/0146627 | A1 | 7/2006 | Park et al. |

(Continued)

*Primary Examiner* — Yuriy Semenenko
(74) *Attorney, Agent, or Firm* — Harness, Dickey and Pierce, P.L.C.

(57) ABSTRACT

A printed circuit board may include a controller socket, first and second sockets provided on a top surface, third and fourth sockets provided on a bottom surface, and first, second, and third branching points. The first branching point may be spaced apart from the controller socket by a first distance in a horizontal direction parallel to the top surface and may be electrically connected to the controller socket. The second branching point may be spaced apart from the first branching point by a second distance longer than the first distance and may be electrically connected to the first branching point, the first and third sockets. The third branching point may be spaced apart from the first branching point by a third distance longer than the first distance and may be electrically connected to the first branching point, the second and fourth sockets.

18 Claims, 23 Drawing Sheets

(56) References Cited

U.S. PATENT DOCUMENTS

| | | | |
|---|---|---|---|
| 2007/0158827 A1* | 7/2007 | Schuster | G11C 5/04 |
| | | | 257/723 |
| 2007/0194968 A1* | 8/2007 | Sung | G11C 5/04 |
| | | | 341/154 |
| 2008/0080261 A1* | 4/2008 | Shaeffer | G11C 5/025 |
| | | | 365/189.05 |
| 2010/0049914 A1* | 2/2010 | Goodwin | G06F 3/0626 |
| | | | 711/114 |
| 2010/0067278 A1 | 3/2010 | Oh et al. | |
| 2011/0176345 A1* | 7/2011 | Chen | H05K 1/025 |
| | | | 365/51 |
| 2013/0208542 A1* | 8/2013 | Park | G11C 16/04 |
| | | | 365/185.05 |
| 2014/0192583 A1* | 7/2014 | Rajan | G11C 7/10 |
| | | | 365/63 |
| 2016/0134036 A1 | 5/2016 | Huang et al. | |
| 2016/0205767 A1 | 7/2016 | Subramanian | |
| 2016/0338190 A1* | 11/2016 | Chang | H05K 1/0248 |

* cited by examiner

PRINTED CIRCUIT BOARD AND STORAGE DEVICE INCLUDING PRINTED CIRCUIT BOARD

CROSS-REFERENCE TO RELATED APPLICATIONS

This U.S. non-provisional patent application claims priority under 35 U.S.C. § 119 to Korean Patent Application No. 10-2018-0061301, filed on May 29, 2018, in the Korean Intellectual Property Office, the entire contents of which are hereby incorporated by reference.

BACKGROUND OF THE INVENTION

Example embodiments relate to a semiconductor memory. For example, at least some example embodiments relate to a printed circuit board and/or a storage device including a printed circuit board.

Semiconductor memory devices may be classified into volatile memory devices (e.g., a static random access memory (SRAM), a dynamic RAM (DRAM), and a synchronous DRAM (SDRAM)), which lose data stored therein at power-off, and non-volatile memory devices (e.g., a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM)), which retain data stored therein even at power-off.

In a FLASH-memory-based storage device, various operations are executed based on electric signals. As an example, a storage device may include a controller and non-volatile memory devices, which are configured to communicate with each other through a plurality of signal lines. In order to improve reliability of the storage device, many schemes are being conducted to maintain reliability of signals. However, owing to increasing demand for a storage device with a fast operation speed and a high integration density, it may be difficult to maintain the signal reliability.

SUMMARY

Some example embodiments of the inventive concepts provide a highly reliable printed circuit board and/or a storage device including the highly reliable printed circuit board.

According to some example embodiments of the inventive concepts, a printed circuit board (PCB) with a top surface and a bottom surface may include a controller socket on the top surface; a first socket and a second socket on the top surface; a third socket and a fourth socket on the bottom surface facing the first socket and the second socket, respectively; and signal lines connecting the controller socket to the first socket, the second socket, the third socket and the fourth socket, the signal lines being connected at branching points including, a first branching point electrically connected to the controller socket such that the first branching point is spaced apart from the controller socket by a first distance in a horizontal direction parallel to the top surface, a second branching point electrically connected to the first branching point, the first socket, and the third socket such that the second branching point is spaced apart from the first branching point by a second distance, the second distance being longer than the first distance in the horizontal direction, and a third branching point electrically connected to the first branching point, the second socket, and the fourth socket such that the third branching point is spaced apart from the first branching point by a third distance, the third distance being longer than the first distance in the horizontal direction.

According to some example embodiments of the inventive concepts, a storage device may include non-volatile memory devices including a first non-volatile memory device, a second non-volatile memory device, a third non-volatile memory device and a fourth non-volatile memory device; a memory controller configured to control the non-volatile memory devices; and a plurality of signal lines including, a first signal line configured to electrically connect the memory controller to a first branching point, a second signal line configured to electrically connect the first branching point to a second branching point, the second signal line being longer than the first signal line, a third signal line configured to electrically connect the first branching point to a third branching point, the third signal line being longer than the first signal line, a fourth signal line configured to electrically connect the second branching point to the first non-volatile memory device, a fifth signal line configured to electrically connect the second branching point to the second non-volatile memory device, a sixth signal line configured to electrically connect the third branching point to the third non-volatile memory device, and a seventh signal line configured to electrically connect the third branching point to the fourth non-volatile memory device.

According to some example embodiments of the inventive concepts, a storage device may include a memory controller; a plurality of non-volatile memory devices including a first non-volatile memory device, a second non-volatile memory device, a third non-volatile memory device and a fourth non-volatile memory device; and a printed circuit board including a top surface and a bottom surface, the top surface having the first non-volatile memory device and the second non-volatile memory device mounted thereon, and the bottom surface having the third non-volatile memory device and the fourth non-volatile memory device mounted thereon such that the third non-volatile memory device faces the first non-volatile memory device and the fourth non-volatile memory device faces the third non-volatile memory device, the printed circuit board including signal lines connecting the memory controller to the plurality of non-volatile memory devices, the signal lines being connected at branching points including, a first branching point electrically connected to the memory controller such that the first branching point is spaced apart from the memory controller by a first distance in a horizontal direction parallel to the top surface, a second branching point electrically connected to the first branching point, the first non-volatile memory device, and the third non-volatile memory device such that the second branching point is spaced apart from the first branching point by a second distance in the horizontal direction, the second distance being longer than the first distance, and a third branching point electrically connected to the first branching point, the second non-volatile memory device, and the fourth non-volatile memory device such that the third branching point is spaced apart from the first branching point by a third distance in the horizontal direction, the third distance being longer than the first distance.

According to some example embodiments of the inventive concepts, a printed circuit board (PCB) with a top surface and a bottom surface may include a controller socket provided on the top surface; a plurality of sockets on the PCB, the plurality of sockets including, a first socket on the top surface, a second socket on the top surface and spaced apart from the first socket by a set distance, a third socket on the top surface between the first socket and the second socket, a fourth socket on the bottom surface facing the first socket, a fifth socket on the bottom surface facing the second socket, and a sixth socket on the bottom surface facing the third socket; and signal lines connecting the controller socket to the plurality of sockets, the signal lines being connected at branching points including, a first branching point electrically connected to the controller socket, a second branching point electrically connected to the first branching point, the first socket and the second socket, and a third branching point electrically connected to the first branching point, the fourth socket and the fifth socket.

According to some example embodiments of the inventive concepts, a storage device may include a memory controller; a plurality of non-volatile memory devices including a first non-volatile memory device, a second non-volatile memory device, a third non-volatile memory device, a fourth non-volatile memory device, a fifth non-volatile memory device and a sixth non-volatile memory device; and a printed circuit board including a top surface and a bottom surface, the top surface having the first non-volatile memory device and the second non-volatile memory device mounted thereon with the third non-volatile memory device mounted therebetween, and the bottom surface having the fourth non-volatile memory device, the fifth non-volatile memory device and the sixth non-volatile memory device mounted thereon facing the first non-volatile memory device, the second non-volatile memory device and the third non-volatile memory device, respectively, the printed circuit board including, a first branching point electrically connected to the memory controller, a second branching point electrically connected to the first branching point, the first non-volatile memory device and second non-volatile memory device, and a third branching point electrically connected to the first branching point, the fourth non-volatile memory device and the fifth non-volatile memory device.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which some example embodiments are shown.

Figure 1:
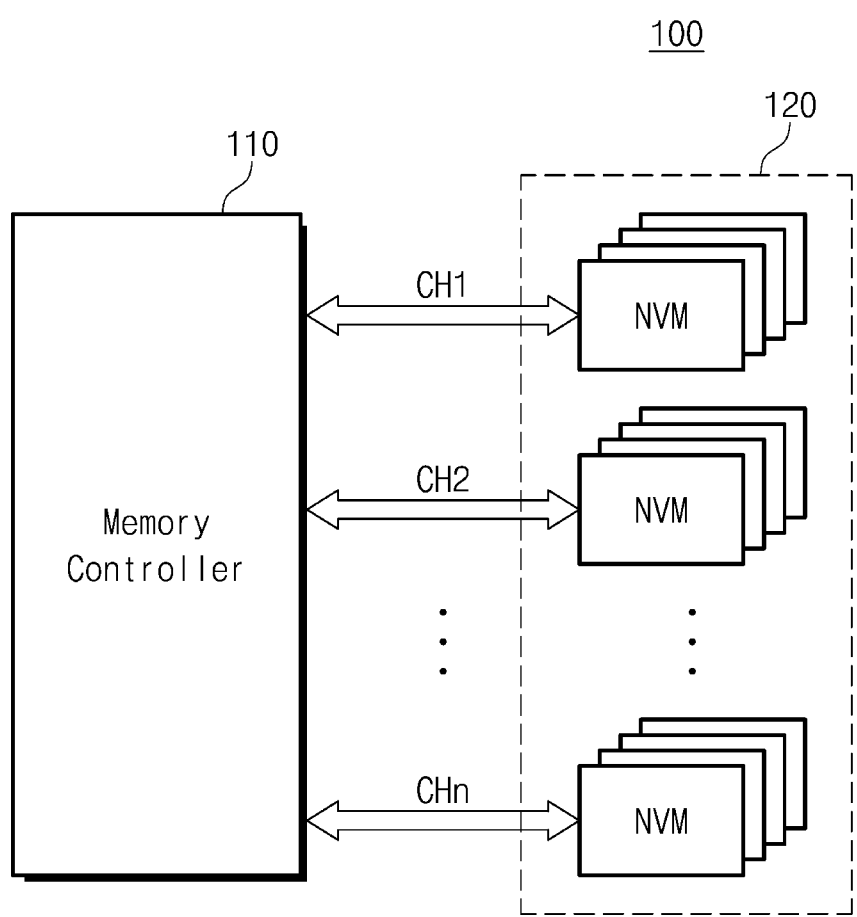
FIG. 1 is a block diagram illustrating a storage device according to an example embodiment of the inventive concepts.

FIG. 1 is a block diagram illustrating a storage device according to an example embodiment of the inventive concepts.

Referring to FIG. 1, a storage device 100 may include a memory controller 110 and a plurality of non-volatile memory devices 120.

The memory controller 110 may control the non-volatile memory devices 120. For example, the memory controller 110 may control the non-volatile memory devices 120 through a plurality of channels CH1-CHn, respectively.

The non-volatile memory devices 120 may be operated based on signals, which are transmitted from the memory controller 110 through the channels CH1-CHn. For example, under the control of the memory controller 110, each of the non-volatile memory devices 120 may be configured to store data, which are transmitted through the channels CH1-CHn, and/or to transmit the stored data to the memory controller 110 through the channels CH1-CHn.

In some example embodiments, each of the non-volatile memory devices 120 may be a NAND FLASH memory chip or a multi-chip package including a plurality of NAND FLASH memory chips, but the inventive concepts are not limited thereto. For example, each of the non-volatile memory devices 120 may be one of various memory devices, such as a static RAM (SRAM) device, a dynamic RAM (DRAM) device, a synchronous DRAM (SDRAM) device, a phase-change RAM (PRAM) device, a magnetic RAM (MRAM) device, a resistive RAM (RRAM) device, and a ferroelectric RAM (FRAM) device.

In some example embodiments, each or one (e.g., the first channel CH1) of the channels CH1-CHn may be used to allow at least two of the non-volatile memory devices 120 to communicate with the memory controller 110. In other words, the storage device 100 may have a multi-rank structure (or, topology). For example, a signal, which is planned to be transmitted to a first memory device connected to the first channel CH1, may be provided other memory devices connected to the first channel CH1.

Conventionally, reflection signals, which are produced by such other memory devices, may be transmitted to the first memory device. The reflection signal transmitted to the first memory device may influence a normally-received signal of the first memory device. This may lead to an abnormal signal reception or malfunction in the first memory device.

In contrast, in one or more example embodiments, the storage device 100 according to an example embodiment of the inventive concepts, a channel or a signal line between the memory controller 110 and the non-volatile memory devices 120 may be configured to have an adjusted (e.g., increased) length in a specific section. Therefore, the storage device 100 may reduce the influence of a reflection signal on a plurality of non-volatile memory devices, which are connected to the same channel. Some features of the storage device 100 associated with the length of the signal line will be described in more detail with reference to the accompanying drawings.

In some example embodiments, each of the non-volatile memory devices 120 may be a memory package including a plurality of non-volatile memory chips or dies. In some example embodiments, since each of the non-volatile memory devices 120 includes a plurality of non-volatile memory chips or dies, it may be possible to easily realize a large capacity storage device. For convenience in description, the term "memory device" will be used in the following description, but it may also be interpreted as referring to a memory package including a plurality of memory chips.

Figure 2A:
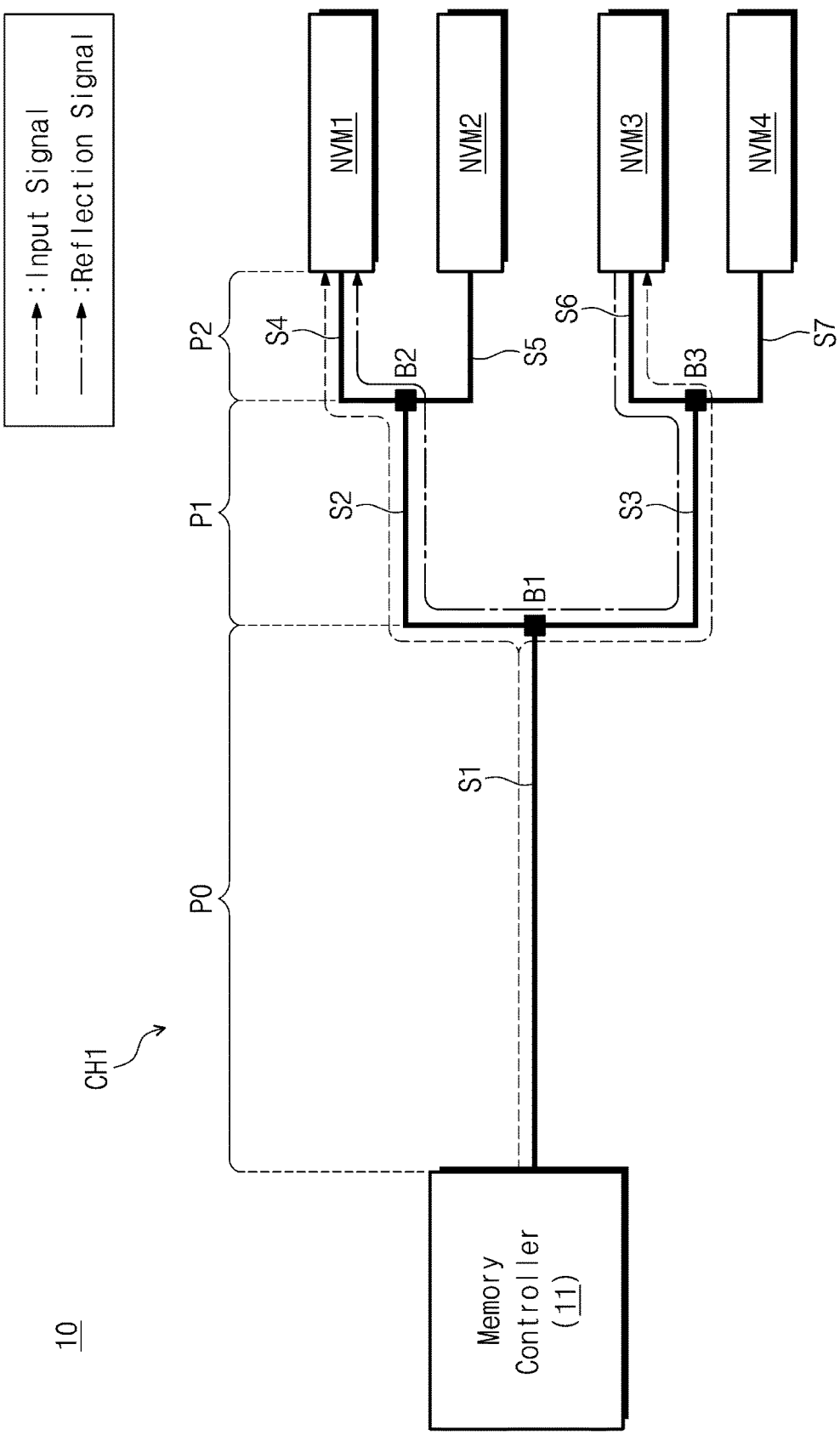
FIGS. 2A and 2B are a block diagram and a timing diagram, which are provided to illustrate a signal flow between a memory controller and a non-volatile memory device.
Figure 2B:
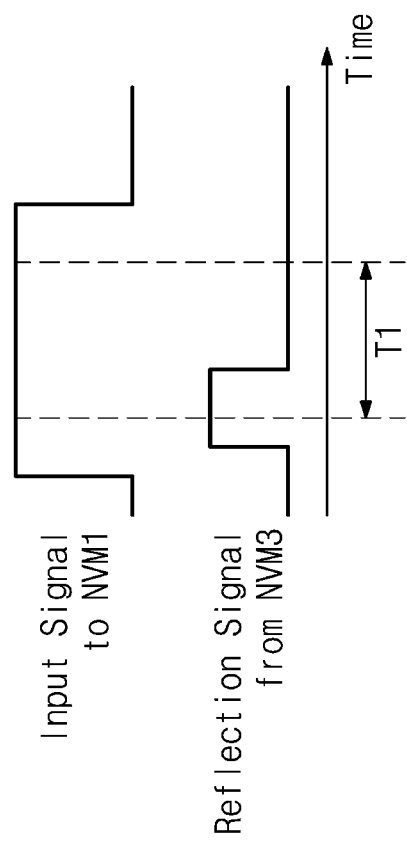

FIGS. 2A and 2B are a block diagram and a timing diagram, which are provided to illustrate a signal flow between a memory controller and a non-volatile memory device. For convenience in description, the following description will focus on a portion of the storage device 100, in which first to fourth non-volatile memory devices NVM1-NVM4 connected to the first channel CH1 and one signal line of a plurality of signal lines constituting the first channel CH1 are provided. However, the inventive concepts are not limited thereto, and in certain example embodiments, the first channel CH1 may further include a plurality of signal lines. In certain example embodiments, a memory controller 11 may be further connected to other non-volatile memory devices through the first channel CH1.

In the timing diagram of FIG. 2B, the horizontal and vertical axes represent time and signal amplitude, respectively. For convenience in description, the timing diagram of FIG. 2B is illustrated in a simplified manner, but a wave form of a signal, which is actually provided through a signal line, is not limited to that of FIG. 2B.

Referring to FIG. 2A, the memory controller 11 may be connected to the first to fourth non-volatile memory devices NVM1-NVM4 through signal lines S1-S7 of the first channel CH1. In some example embodiments, the signal lines S1-S7 of the first channel CH1 may represent a single interconnection structure for transmitting a data signal DQ or one of other control signals to at least one of the non-volatile memory devices NVM1-NVM4.

For example, the signal lines S1-S7 may be used to provide one signal (e.g., the data signal DQ) to each of the non-volatile memory devices NVM1-NVM4. In other words, each of the first to fourth non-volatile memory devices NVM1-NVM4 may be configured to receive the same signal, which are transmitted from the memory controller 11 through the signal lines S1-S7 of the first channel CH1. To do this, the first channel CH1 may include a plurality of branching points B1, B2, and B3 and may be divided into a plurality of sections P0, P1, and P2, based on locations of branching points B1, B2, and B3.

In some example embodiments, the sections P0, P1, and P2 may be defined in such a way that three of the signal lines S1-S7 meet each other at each of the branching points B1, B2, and B3. For example, the zeroth section P0 may include the signal line S1 from the memory controller 11 to the first branching point B1. The first section P1 may include the signal line S2 from the first branching point B1 to the second branching point B2 and the signal line S3 from the first branching point B1 to the third branching point B3. The second section PR2 may include the signal lines S4 and S5 from the second branching point B2 to the first and second non-volatile memory devices NVM1 and NVM2 and the signal lines S6 and S7 from the third branching point B3 to the third and fourth non-volatile memory devices NVM3 and NVM4. In other words, each signal line may branch out into two signal lines at the branching points B1, B2, and B3, and thus, the memory controller 11 and each of the first to fourth non-volatile memory devices NVM1-NVM4 may be electrically connected to each other.

In some example embodiments, the zeroth section P0 may include one signal line (e.g., S1). The first section P1 may include two signal lines (e.g., S2 and S3). The second section P2 may include four signal lines (e.g., S4, S5, S6, and S7). However, the inventive concepts are not limited to this example, and the number of the signal lines in each section may be changed, depending on the number of the non-volatile memory devices connected to a single channel.

In some example embodiments, the memory controller 11 may use an additional control signal (e.g., a chip selection signal) to select a non-volatile memory device, to which a signal will be transmitted. For example, in the case where the memory controller 11 transmits an input signal to the first non-volatile memory device NVM1, the memory controller 11 may activate a chip selection signal for selecting the first non-volatile memory device NVM1 and then may transmit the input signal to the first to fourth non-volatile memory devices NVM1-NVM4 through the signal lines S1-S7. In some example embodiments, the chip selection signal may be provided to each of the first to fourth non-volatile memory devices NVM1-NVM4 through additional signal lines, which are different from each other.

Here, since the input signal is provided to not only the selected device (e.g., the first non-volatile memory device NVM1) but also the unselected devices (e.g., the non-volatile memory devices NVM2-NVM4), a reflection wave or signal may be produced by the unselected non-volatile memory devices NVM2-NVM4. For example, in the case where the memory controller 11 transmits an input signal, which is prepared for the first non-volatile memory device NVM1, to the first non-volatile memory device NVM1 through the signal lines S1-S7, the third non-volatile memory device NVM3 may produce a reflection signal, owing to impedance mismatching at an input terminal of the third non-volatile memory device NVM3.

In some example embodiments, each of the first to fourth non-volatile memory devices NVM1-NVM4 may include an on-die termination (ODT) resistor for impedance matching. The ODT resistor may be provided to realize an impedance matching between a signal line and a plurality of memory devices, thereby hindering (or, alternatively, preventing) a reflection signal from occurring. However, in the case where an operation speed of the storage device 100 is higher than a specific speed (i.e., the storage device 100 is configured to execute a high speed operation), a conventional ODT resistor may have a difficulty in effectively suppressing the reflection signal.

In FIG. 2A, a dash line represents an input signal from the memory controller 11, whereas a dash-single dotted line represents a reflection signal from the third non-volatile memory device NVM3. As shown in FIG. 2A, the reflection signal from the third non-volatile memory device NVM3 may be transmitted to the first non-volatile memory device NVM1 through the signal lines S6, S3, S2, and S4. In other words, the first non-volatile memory device NVM1 may receive not only the input signal from the memory controller 11 but also the reflection signal from the third non-volatile memory device NVM3.

In this case, the first non-volatile memory device NVM1 may have a difficulty in normally determining the input signal. For example, a sensing margin for the input signal may be a first time T1, as shown in FIG. 2B. At a specific operation speed, the reflection signal may be transmitted to the first non-volatile memory device NVM1, within the first time T1 or in a rising edge region. In this case, the reflection signal may cause signal distortion, within the first time T1, and as a result, the first non-volatile memory device NVM1 may have a difficulty in precisely determining the input signal.

Figure 3A:
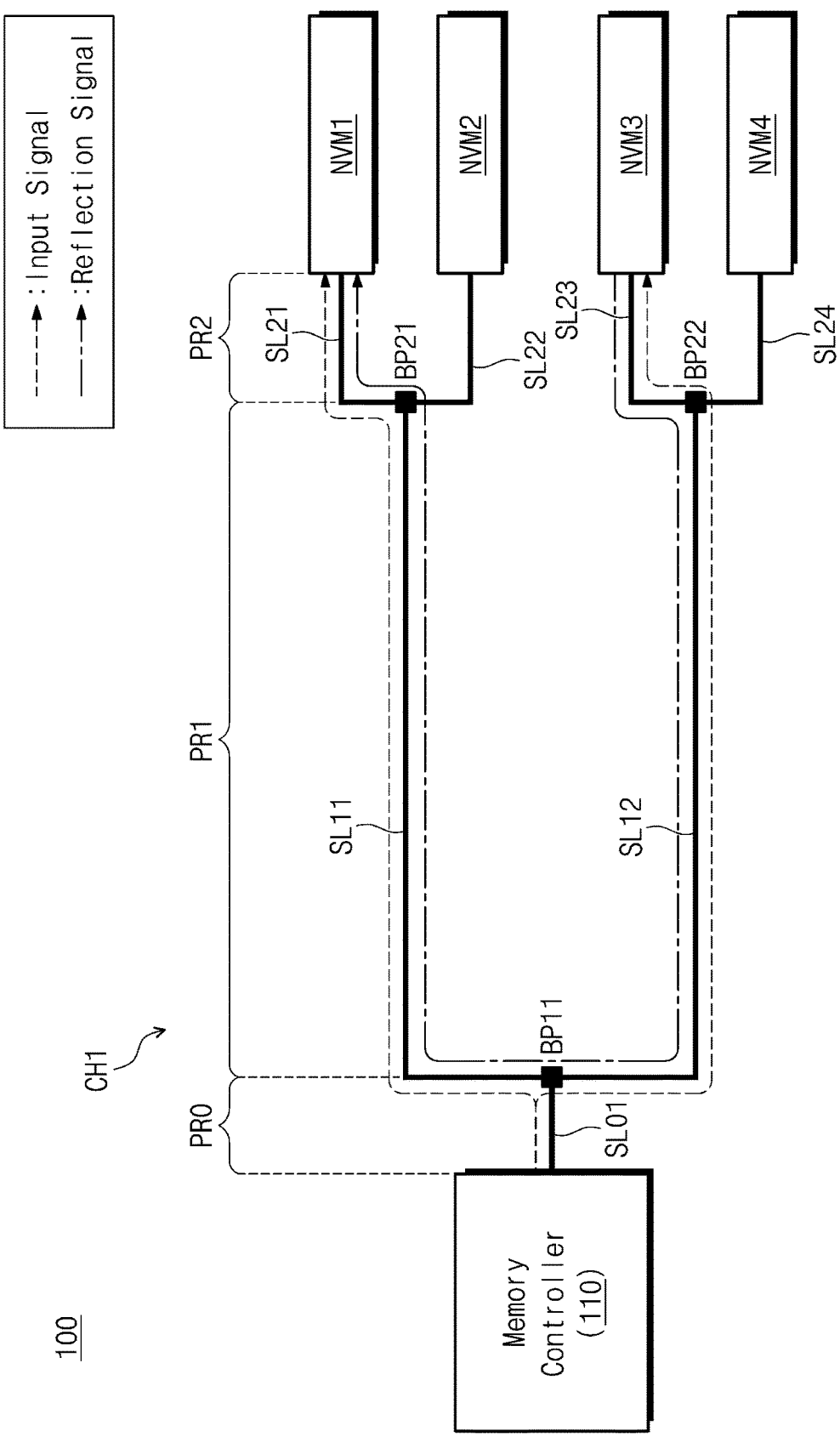
FIGS. 3A and 3B are a block diagram and a timing diagram, which are provided to illustrate a signal flow in a storage device according to an example embodiment of the inventive concepts.
Figure 3B:
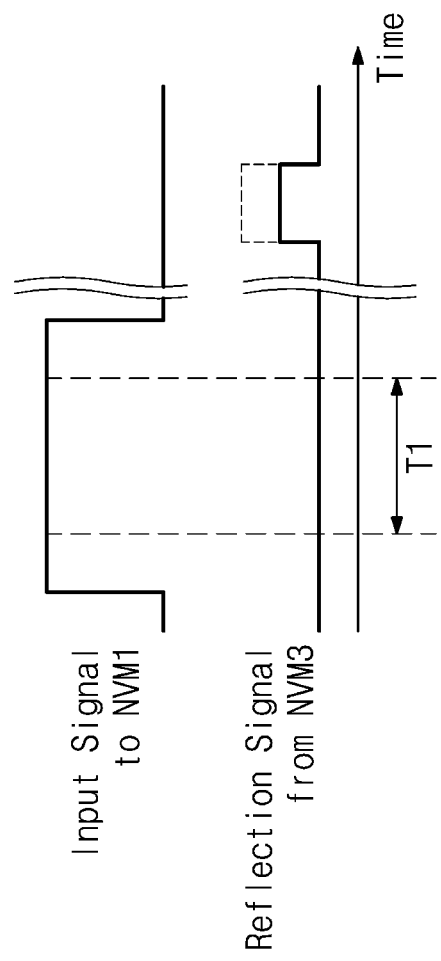

FIGS. 3A and 3B are a block diagram and a timing diagram, which are provided to illustrate a signal flow in a storage device according to an example embodiment of the inventive concepts. For concise description, a previously described element may be identified by the reference number without repeating an overlapping description thereof.

Referring to FIG. 3A, the storage device 100 may include the memory controller 110 and the first to fourth non-volatile memory devices NVM1-NVM4. The first channel CH1 may include signal lines SL01, SL11, SL12, SL21, SL22, SL23, and SL24, and the memory controller 110 may be connected to each of the first to fourth non-volatile memory devices NVM1-NVM4 through the signal lines SL01, SL11, SL12, SL21, SL22, SL23, and SL24 included in the first channel CH1. Similar to the previously-described structure, the first channel CH1 may include a plurality of branching points BP11, BP21, and BP22 and may be divided into zeroth, first, and second sections PR0, PR1, and PR2, based on locations of the branching points BP11, BP21, and BP22. This division of the first channel CH1 is similar to that of the previous example, and thus, a detailed description thereof will be omitted.

In the storage device 100 according to an example embodiment of the inventive concepts, a length of a channel or a length of a signal line in a specific section may be adjusted to reduce an undesirable interference between the non-volatile memory devices, which may be caused by the reflection signal. For example, in the structure of FIG. 3A, the lengths of the signal lines SL11 and SL12 in the first section PR1 may be increased, compared with the structure of FIG. 2A. In other words, the lengths of the signal lines SL11 and SL12 of FIG. 3A may be longer than the lengths of the signal lines S2 and S3 of FIG. 2A, respectively.

In some example embodiments, a length of each of the signal lines SL11 and SL12 in the first section PR1 may be longer than a length of the signal line SL01 in the zeroth section PR0. In certain embodiments, the length of each of the signal lines SL11 and SL12 in the first section PR1 may be increased to hinder (or, alternatively, prevent) a reflection signal from the third or fourth non-volatile memory device NVM3 or NVM4 from affecting an input signal to be transmitted to the first or second non-volatile memory device NVM1 or NMV2. In certain example embodiments, the length of each of the signal lines SL11 and SL12 in the first section PR1 may be increased in such a way that the reflection signal is attenuated below a specific level. Here, the specific level may be determined to substantially hinder (or, alternatively, prevent) the reflection signal from the third or fourth non-volatile memory device NVM3 or NVM4 from affecting an input signal to be transmitted to the first or second non-volatile memory device NVM1 or NMV2. In certain example embodiments, the length of the signal lines SL11 and SL12 in the first section PR1 may be increased to delay the reflection signal by a specific period of time. Here, the specific period of time may be determined to substantially hinder (or, alternatively, prevent) the reflection signal from the third or fourth non-volatile memory device NVM3 or NVM4 from affecting an input signal to be transmitted to the first or second non-volatile memory device NVM1 or NMV2.

For example, in the case where the memory controller 110 transmits an input signal, which is prepared for the first non-volatile memory device NVM1, the input signal may be provided to the first non-volatile memory device NVM1 through the signal lines SL01, SL11, and SL21. In this case, the input signal may also be provided to the third non-volatile memory device NVM3 through the signal lines SL01, SL12, and SL23. As described above, a reflection signal may be produced by the third non-volatile memory device NVM3 and may be transmitted to the first non-volatile memory device NVM1 through the signal lines SL23, SL12, SL11, and SL21.

In this case, due to the increase in the length of each of the signal lines SL12 and SL11 in the first section PR1, it may be possible to effectively prevent or suppress the reflection signal from the third non-volatile memory device NVM3 from affecting the input signal (i.e., to be transmitted to the first non-volatile memory device NVM1). For example, since each of the signal lines SL12 and SL11 in the first section PR1 has an increased length, the signal lines SL11 and SL12 in the first section PR1 may allow the reflection signal from the third non-volatile memory device NVM3 to have an attenuated amplitude lower than a specific level, as shown in FIG. 3B. In other words, due to its attenuated amplitude, the reflection signal may have a small influence on the input signal to be transmitted to the first non-volatile memory device NVM1. That is, since the reflection signal should propagate through the elongated signal lines SL12 and SL11, the reflection signal may have a lowered amplitude or lost energy, when it is transmitted to the first non-volatile memory device NVM1. This may make it possible to reduce the influence of reflection signals, which are produced by other non-volatile memory devices, on operations of the first non-volatile memory device NVM1.

In certain example embodiments, the signal lines SL11 and SL12 in the first section PR1 may be configured to delay the reflection signal by a specific time. For example, this may make it possible to allow the reflection signal to be transmitted to the first non-volatile memory device NVM1 after the first time T1 (i.e., the sensing margin) of the input signal and thereby to reduce the influence of the reflection signal on the first non-volatile memory device NVM1. In other words, since the elongated signal lines SL12 and SL11 are located on the propagation path of the reflection signal from the third non-volatile memory device NVM3 to the first non-volatile memory device NVM1, the propagation time of the reflection signal may be increased by a delay time that is given by the increased length of the signal lines; that is, it takes a longer time for the reflection signal from the third non-volatile memory device NVM3 to be transmitted to the first non-volatile memory device NVM1. This means that the reflection signal from the third non-volatile memory device NVM3 does not affect the input signal to be transmitted to the first non-volatile memory device NVM1 or that the first non-volatile memory device NVM1 can normally determine the input signal without any influence of the reflection signal.

Although not illustrated in the drawings, due to the increased lengths of the signal lines SL11 and SL12 in the first section PR1, it may be possible to reduce the influence of the reflection signal, which is produced by the fourth non-volatile memory device NVM4, on operations of the first non-volatile memory device NVM1. Furthermore, it may be possible to reduce the influence of reflection signals, which are produced by the third or fourth non-volatile memory device NVM3 or NVM4, on operations of the second non-volatile memory device NVM2. In certain embodiments, it may also be possible to reduce the influence of reflection signals, which are produced by the first or second non-volatile memory device NVM or NVM2, on operations of the third or fourth non-volatile memory device NVM3 or NVM4. In other words, it may be possible to reduce an undesirable interference phenomenon between a first group including the first and second non-volatile memory devices NVM1 and NVM2 and a second group including the third and fourth non-volatile memory devices NVM3 and NVM4, which are caused by reflection signals produced by different groups.

As described above, the signal lines SL11 and SL12 may be used to reduce or attenuate amplitudes of reflection signals, which are produced by the first to fourth non-volatile memory devices NVM1-NVM4, below a specific level. In such a case, it may be possible to reduce the influence of the reflection signals on an input signal to be transmitted to an activated non-volatile memory device.

In certain example embodiments, the signal lines SL11 and SL12 may be used to retard the propagation of the reflection signals, which are produced by the first to fourth non-volatile memory devices NVM1-NVM4, by a specific delay time. Here, the specific delay time may be determined to substantially hinder (or, alternatively, prevent) the produced reflection signal from affecting another non-volatile memory device during its activation period. For example, the specific delay time may be determined in consideration of an operation speed of the storage device 100.

Figure 4:
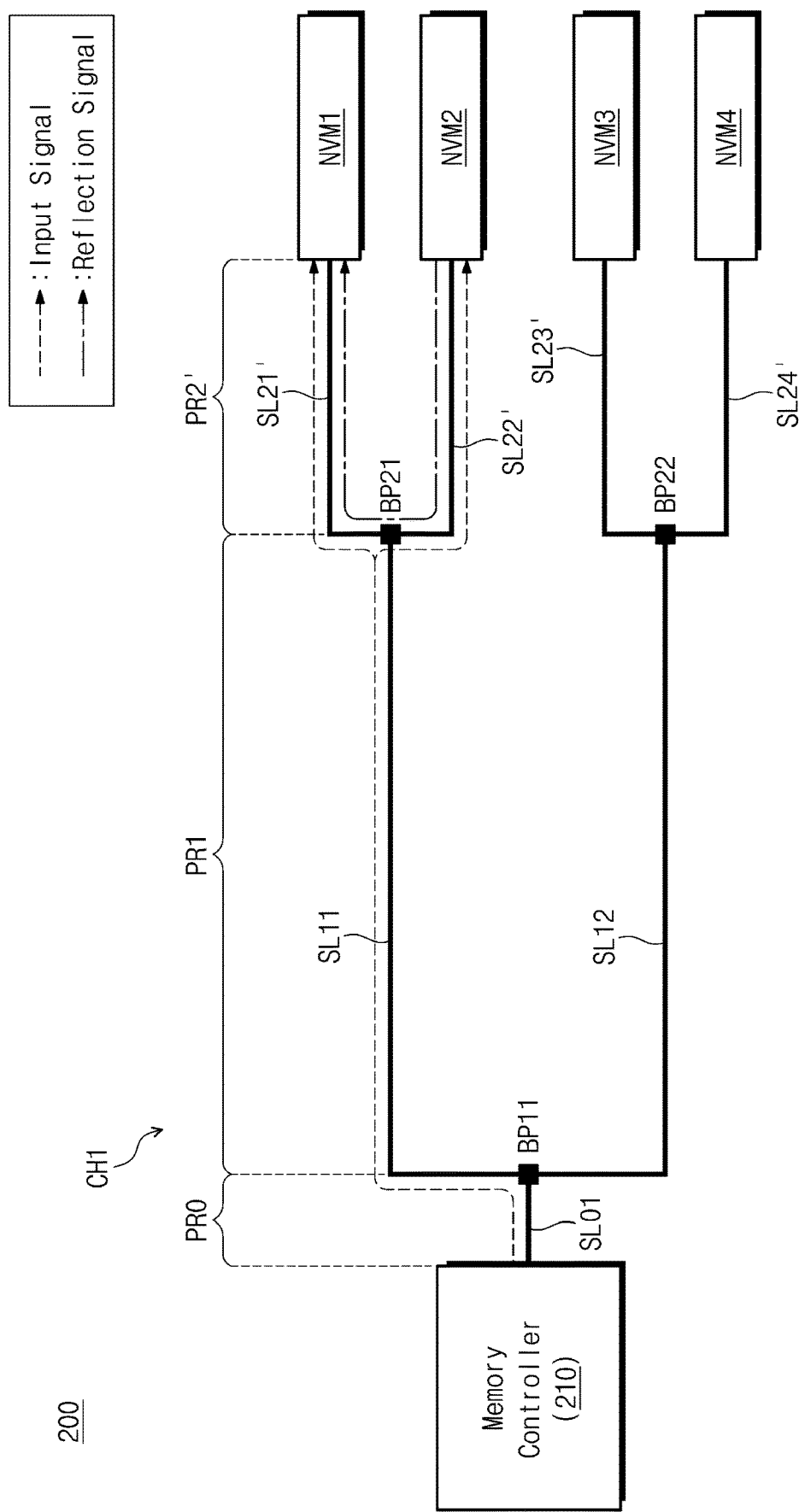
FIG. 4 is a block diagram illustrating a signal flow in a storage device according to an example embodiment of the inventive concepts.
Figure 5A:
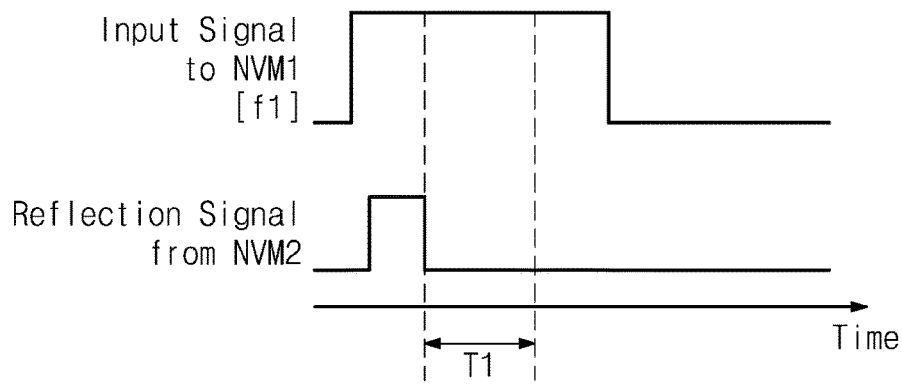
FIGS. 5A to 5C are timing diagrams, each of which is provided to illustrate the signal flow shown in FIG. 4.
Figure 5B:
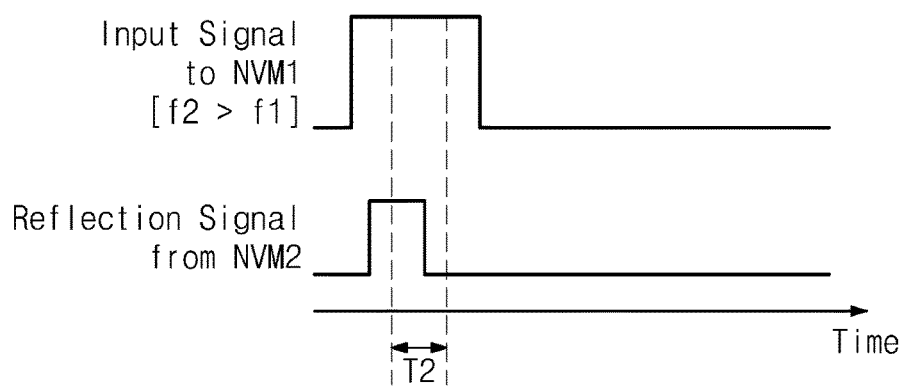
Figure 5C:
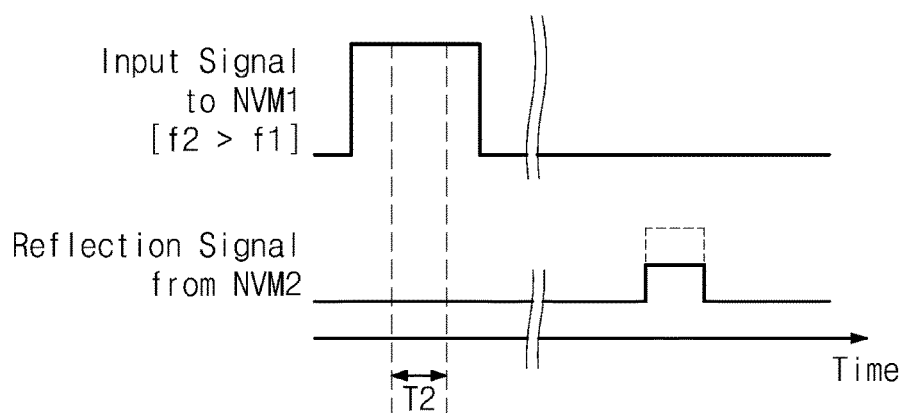

FIG. 4 is a block diagram illustrating a signal flow in a storage device according to an example embodiment of the inventive concepts. FIGS. 5A to 5C are timing diagrams, each of which is provided to illustrate the signal flow shown in FIG. 4. For concise description, a previously described element may be identified by the reference number without repeating an overlapping description thereof.

Referring to FIG. 4, a storage device 200 may include a memory controller 210 and the first to fourth non-volatile memory devices NVM1-NVM4. Similar to the previously-described structure, the memory controller 210 may be connected to the first to fourth non-volatile memory devices NVM1-NVM4 through the signal lines of the first channel CH1. The first channel CH1 may include the branching points BP11, BP21, and BP22 and may be divided into the zeroth, first, and second sections PR0, PR1, and PR2, based on locations of the branching points BP11, BP21, and BP22.

As described with reference to FIG. 3A, the lengths of the signal lines SL11 and SL12 in the first section PR1 may be increased to reduce or suppress an undesirable interference between the first and second non-volatile memory devices NVM1 and NVM2 and the third and fourth non-volatile memory devices NVM3 and NVM4, which may be caused by reflection signals.

In the case where the operation speed of the storage device 200 is higher than a reference speed, the first and second non-volatile memory devices NVM1 and NVM2 may be mutually affected by a reflection signal therebetween. For example, as shown in FIG. 4, the reflection signal from the second non-volatile memory device NVM2 may be transmitted to the first non-volatile memory device NVM1. Here, as shown in FIG. 5A, in the case where the input signal has a first frequency f1 (e.g., corresponding to the operation speed of the storage device 200), the reflection signal from the second non-volatile memory device NVM2 may not have an influence on the input signal during the first time T1 (i.e., the sensing margin).

For example, the signal lines SL22 and SL21 may be configured in such a way that the reflection signal from the second non-volatile memory device NVM2 is delayed by a relatively short delay time, compared with than the first frequency f1 (i.e., the operation speed of the storage device 200). That is, in the case where the delay time caused by the signal lines SL21 and SL22 is relatively short, when compared with the operation speed of the storage device 200, the reflection signal from the second non-volatile memory device NVM2 may be transmitted to the first non-volatile memory device NVM1, before the first time T1 of the input signal. In this case, the reflection signal is not transmitted to the first non-volatile memory device NVM1 within the sensing margin of the input signal, and thus, the first non-volatile memory device NVM1 may determine the input signal precisely, without any influence caused by the reflection signal.

By contrast, in the case where the input signal has a second frequency f2 higher than the first frequency f1 (i.e., the storage device 200 has an operation speed faster than the reference speed), the reflection signal may be transmitted into the first non-volatile memory device NVM1, during a second time T2 (i.e., the sensing margin) and a falling edge of the input signal, as shown in FIG. 5B. This is because there is no difference in delay time caused by the signal lines SL21 and SL22 and an overall length of the input signal is shortened by the increase in frequency of the input signal. That is, in the case where the operation speed of the storage device 200 is faster than the reference speed, a signal distortion may result from the reflection signals between the first and second non-volatile memory devices NVM1 and NVM2.

As described above, lengths of signal lines in a specific section (e.g., PR2) may be increased to prevent or suppress physically or electrically adjacent ones of the non-volatile memory devices from being affected by reflection signals therebetween. For example, a length of each of signal lines SL21', SL22', SL23', and SL24' in the second section PR2 of FIG. 4 may be longer than a length of each of the signal lines SL21, SL22, SL23, and SL24 in the second section of FIG. 3.

In other words, by increasing the length of each of the signal lines SL21, SL22, SL23, and SL24 of the second section PR2, it may be possible to reduce the interference phenomenon between the first and second non-volatile memory devices NVM1 and NVM2 and between the third and fourth non-volatile memory devices NVM3 and NVM4, which are caused by reflection signals therebetween.

For example, as shown in FIG. 5C, in the case where the frequency of the input signal has the second frequency f2 higher than the first frequency f1, a length of each of the signal lines SL21', SL22', SL23', and SL24' in the second section PR2 may be increased to reduce the reflection signal from the second non-volatile memory device NVM2 below a specific level and/or to allow the reflection signal to be transmitted to the first non-volatile memory device NVM1 after the input signal. In other words, the first non-volatile memory device NVM1 may normally determine the input signal, without any influence of the reflection signal from the second non-volatile memory device NVM2.

In some example embodiments, the length of each of the signal lines SL21' and SL22' in the second section PR2 may be determined to allow the reflection signals between the first and second non-volatile memory devices NVM1 and NVM2 to have a signal level or a delay time capable of hindering (or, alternatively, preventing) the undesirable influence or interference therebetween. Similarly, the length of each of the signal lines SL23' and SL24' in the second section PR2 may be determined to allow the reflection signals between the third and fourth non-volatile memory devices NVM3 and NVM4 to have a signal level or a delay time capable of hindering (or, alternatively, preventing) the undesirable influence or interference therebetween.

As described above, in the storage device according to an example embodiment of the inventive concepts, a signal line between the memory controller and the plurality of non-volatile memory devices may be configured to have an increased length in a specific section, and this may make it possible to prevent or suppress the non-volatile memory devices from being affected by reflection signals therebetween. In some example embodiments, the length of the signal line in the specific section may be determined in consideration of an operation speed of a storage device, a frequency of an input/output signal, and so forth. In some example embodiments, the length of the signal line in the specific section may be determined to reduce an amplitude of the reflection signal below a specific level. In some example embodiments, the length of the signal line in the specific section may be determined to allow a reflection signal from an unselected non-volatile memory device to have a delay time capable of hindering (or, alternatively, preventing) the reflection signal from arriving at a selected non-volatile memory device, during an activation period of the selected non-volatile memory device.

In some example embodiments, the activation period of the selected non-volatile memory device may represent a period of time, in which the selected non-volatile memory device receives or transmits a signal from or to the memory controller.

Figure 6:
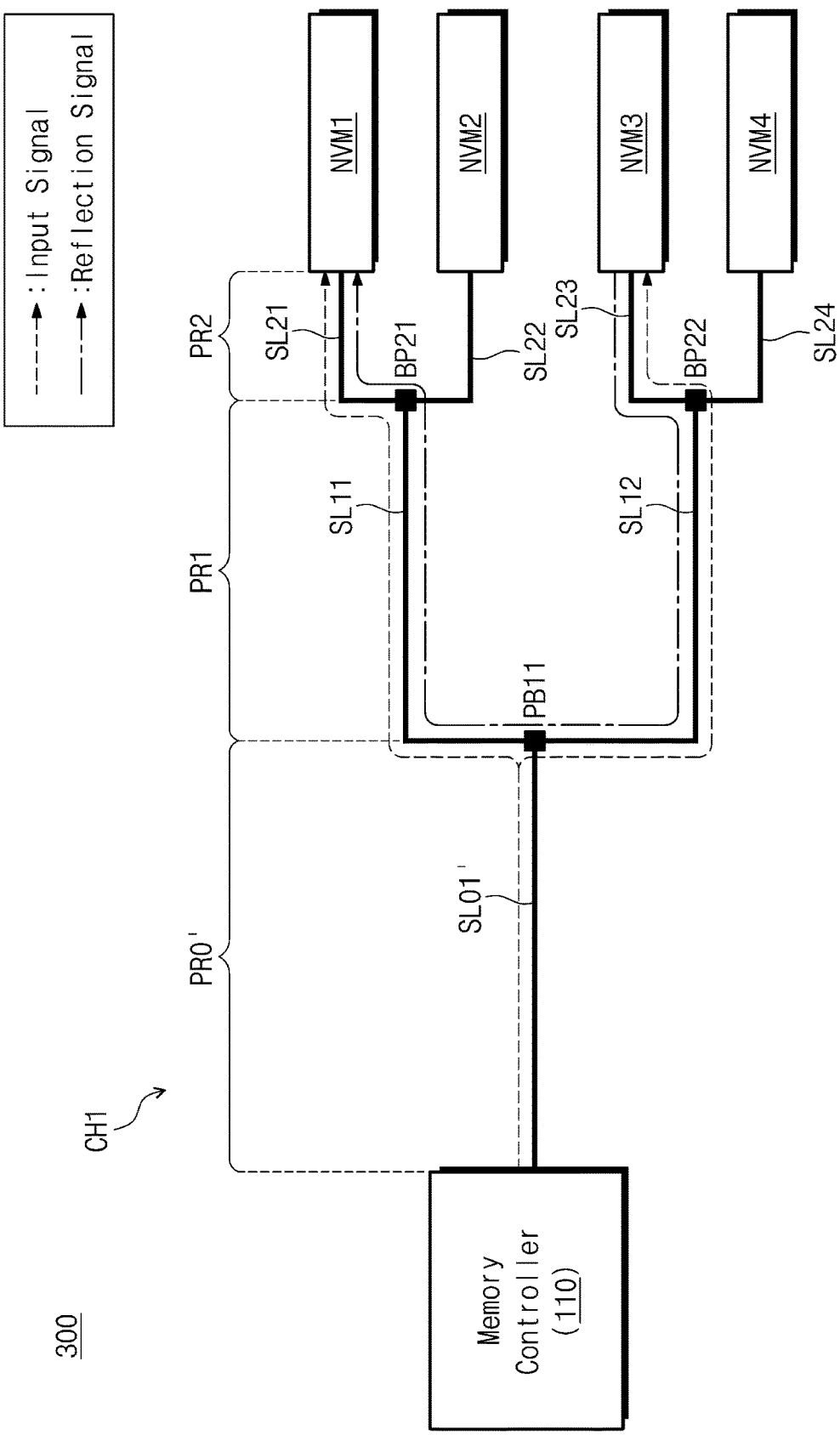
FIG. 6 is a block diagram illustrating a signal flow in a storage device according to an example embodiment of the inventive concepts.

FIG. 6 is a block diagram illustrating a signal flow in a storage device according to an example embodiment of the inventive concepts. For concise description, a previously described element may be identified by the reference number without repeating an overlapping description thereof.

Referring to FIG. 6, a storage device 300 may include a memory controller 310 and the first to fourth non-volatile memory devices NVM1-NVM4. Similar to the previously-described structure, the memory controller 310 may be connected to the first to fourth non-volatile memory devices NVM1-NVM4 through the signal lines of the first channel CH1. The first channel CH1 may include the branching points BP11, BP21, and BP22 and may be divided into zeroth, first, and second sections PR0', PR1, and PR2, based on locations of the branching points BP11, BP21, and BP22.

In some example embodiments, a length of a signal line SL01' in the zeroth section PR0' may be longer than lengths of the signal lines SL11 and SL12 in the first section PR1. In other words, a length of the signal line SL01' in the zeroth section PR0' of FIG. 6 may be longer than the signal line SL01 in the zeroth section PR0 of FIG. 3A or 4. Although the length of the signal line SL01' in the zeroth section PR0' is longer than the lengths of the signal lines SL11 and SL12 in the first section PR1, the lengths of the signal lines SL11 and SL12 in the first section PR1 may be increased, compared with those in the conventional storage device 10 (e.g., see FIG. 2A), and this may make it possible to achieve the afore-described effect of reducing the influence of a reflection signal on the first to fourth non-volatile memory devices NVM1-NVM4, in the same or similar manner.

Figure 7:
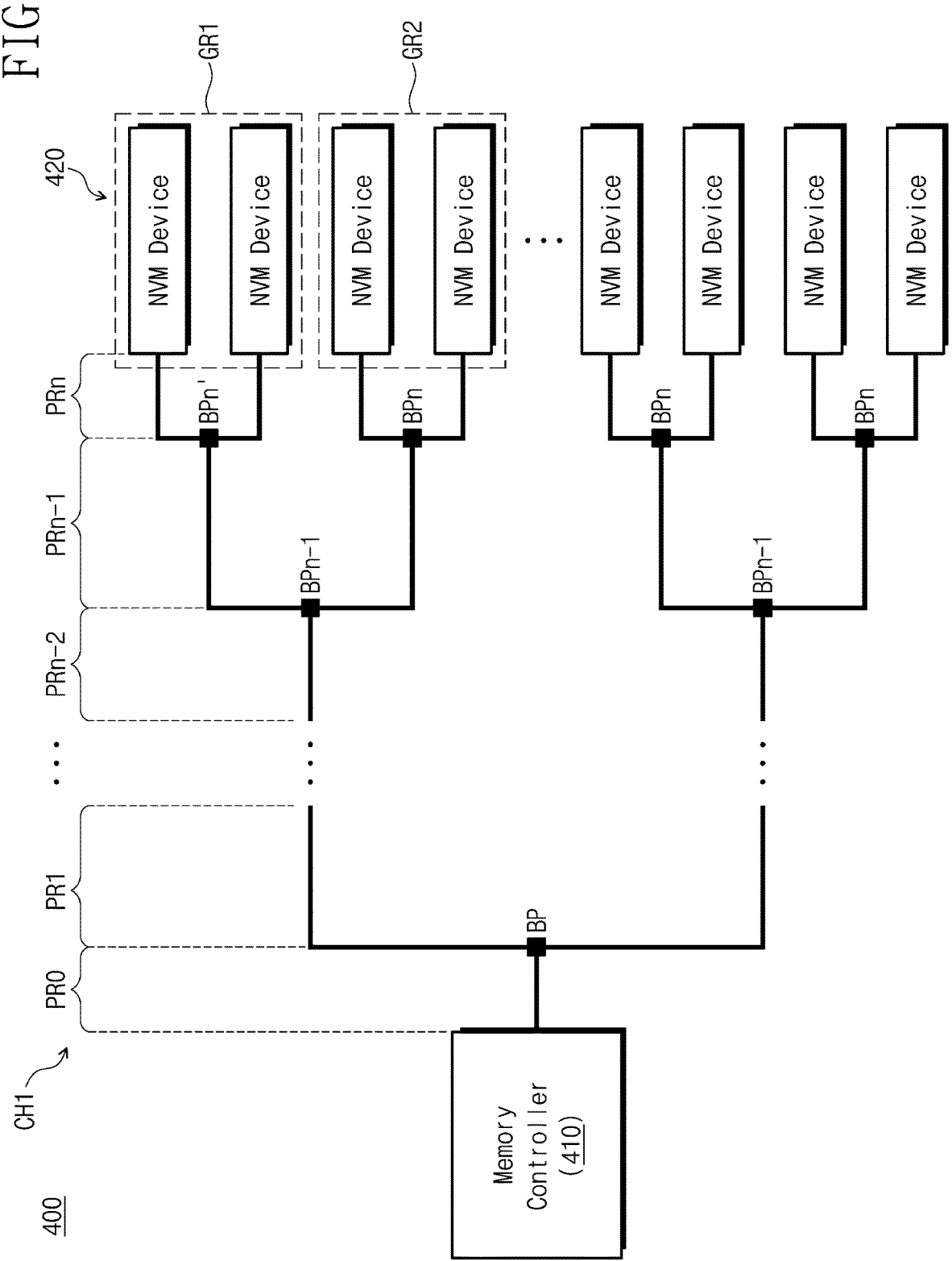
FIG. 7 is a block diagram illustrating an example of a storage device according to an example embodiment of the inventive concepts.

FIG. 7 is a block diagram illustrating an example of a storage device according to an example embodiment of the inventive concepts. For concise description, a previously described element may be identified by the reference number without repeating an overlapping description thereof.

Referring to FIG. 7, a storage device 400 may include a memory controller 410 and a plurality of non-volatile memory devices 420. Similar to the previously-described structure, the memory controller 410 may be configured to communicate with the non-volatile memory devices 420 through the first channel CH1.

The first channel CH1 may include a plurality of branching points BP11-BPnm and may be divided into a plurality of sections PR0, PR1, ..., and PRn, based on locations of the branching points BP11-BPnm. Similar to the previously-described structure, the zeroth section PR0 may include one signal line, the first section PR1 may include two signal lines, and the n-th section PRn may include $2^n$ signal lines. In some example embodiments, there may be one branching point between the zeroth and first sections PR0 and PR1, and there may be two branching points between the first and second sections PR1 and PR2, and there may be $2^{n-1}$ branching points between the (n−1)-th and n-th branching points.

As an example, as shown in FIG. 7, a single signal line branches out into two signal lines at each branching point, but the inventive concepts are not limited thereto. For example, the single signal line may branch out into three or more signal lines, at each branching point.

Similar to the previously-described structure, a length of a signal line in a specific section may be increased to reduce an undesirable interference between the non-volatile the memory devices 320, which may be caused by the reflection signals. For example, a length of a signal line in the lowermost section (i.e., the n-th section PRn) may be increased to reduce the influence of the reflection signal on each of the non-volatile memory devices 420.

In certain example embodiments, the non-volatile memory devices 420 may be classified into a plurality of groups. In this case, a signal line in an upper-level section of a common branching point, at which all of the non-volatile memory devices included in each group are connected, may be provided to have an increased length, and this may make it possible to reduce the interference phenomenon between the groups caused by the reflection signals therebetween. For example, as shown in FIG. 7, in order to reduce the interference phenomenon between a first group GR1 and a second group GR2 caused by reflection signals therebetween, a signal line in an upper-level section (i.e., PRn−1 section) of a branching point BPn1, at which all of the non-volatile memory devices of the first group GR1 are connected, or of a branching point BPn2, at which all of the non-volatile memory devices of the second group GR2 are connected, may be provided to have an increased length.

In some example embodiments, the first and second groups GR1 and GR2 shown in FIG. 7 is just an example that is presented to illustrate an example embodiment of the inventive concepts, but the inventive concepts are not limited to the example. For instance, the number of the non-volatile memory devices included in each group may be variously changed.

Although the above description refers to a write operation of a storage device or an operation of transmitting a signal from the memory controller to one of the non-volatile memory devices, the inventive concepts are not limited thereto. For example, the storage device may be configured to execute a reading operation of transmitting an input signal (e.g., read data) from one of the non-volatile memory devices to the memory controller. Similarly, even in this case, a length of a signal line in a specific section may be adjusted or increased to prevent or suppress reflection signals from unselected ones of the non-volatile memory devices to be transmitted to the memory controller or a selected one of the non-volatile memory devices, during the reading operation of the selected non-volatile memory device.

Figure 8:
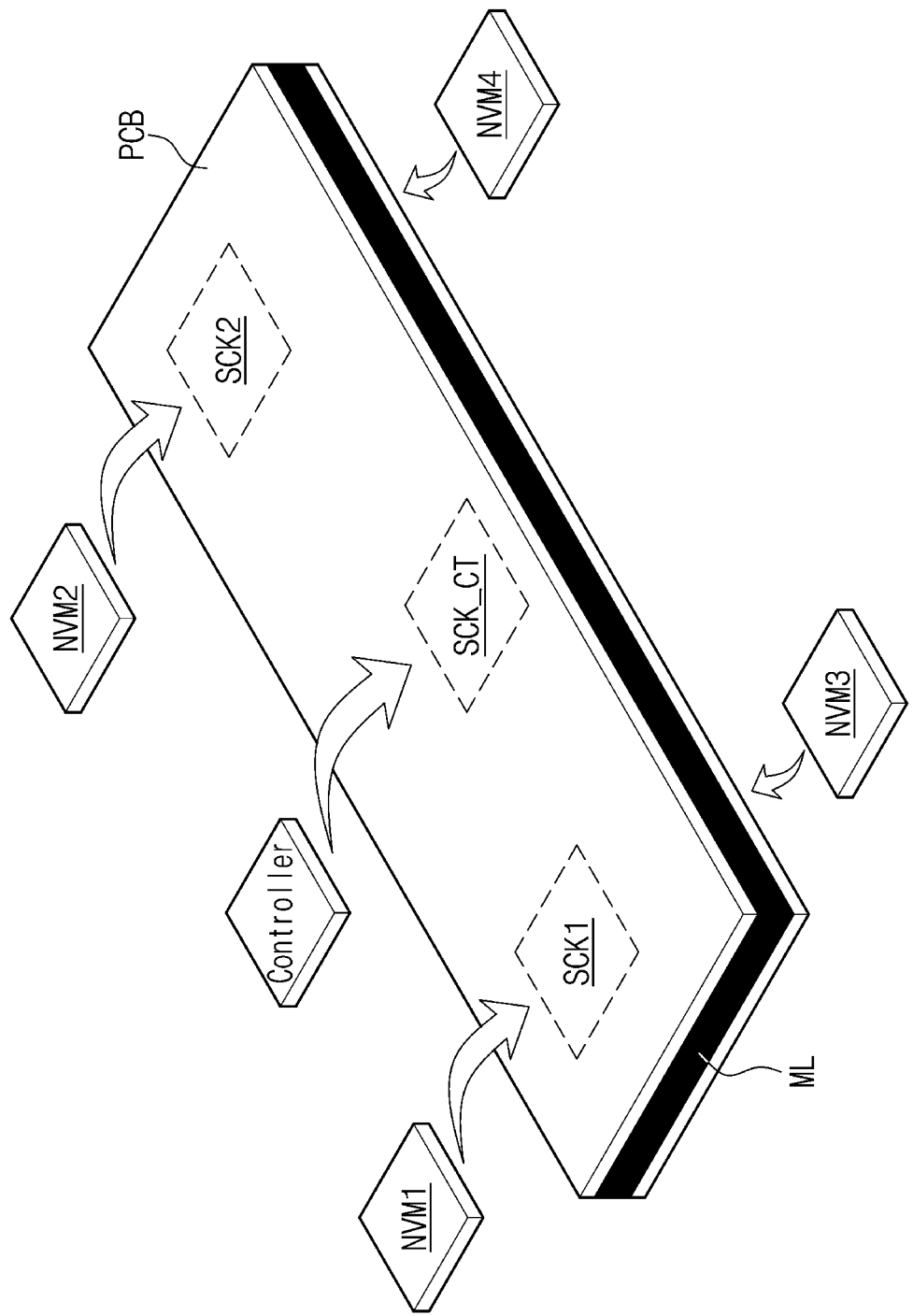
FIG. 8 is a diagram illustrating an example of a storage device according to an example embodiment of the inventive concepts.

FIG. 8 is a diagram illustrating an example of a storage device according to an example embodiment of the inventive concepts. For convenience in illustration, only some elements of the storage device are illustrated in FIG. 8. However, the inventive concepts is not limited thereto, and in certain example embodiments, the storage device 400 may further include other elements (e.g., a buffer memory, at least one additional non-volatile memory device, an auxiliary power supply, and so forth).

Referring to FIG. 8, the storage device may include a printed circuit board PCB, a memory controller, and first to fourth non-volatile memory devices NVM1-NVM4. The memory controller and the first to fourth non-volatile memory devices NVM1-NVM4 may be configured to have substantially the same features as the afore-described ones, and thus, a detailed description thereof will be omitted.

The printed circuit board PCB may include a memory controller socket SCK_CT and first and second sockets SCK1 and SCK2. The memory controller socket SCK_CT may be a region, an element, or a device, which is configured to allow the memory controller 410 to be mounted thereon. Each of the first and second sockets SCK1 and SCK2 may be a region, an element, or a device, which is configured to allow a corresponding one of the first and second non-volatile memory devices NVM1 and NVM2 to be mounted thereon. Although not clearly illustrated in the drawings, the printed circuit board PCB may further include additional sockets provided on the bottom surface thereof. The third and fourth non-volatile memory devices NVM3 and NVM4 may be mounted on the additional sockets, which are provided on the bottom surface of the printed circuit board PCB.

In some example embodiments, the first and second sockets SCK1 and SCK2 may be provided on opposite side regions of the memory controller socket SCK_CT. For example, the memory controller socket SCK_CT may be placed on a middle region of a top surface of the printed circuit board PCB, and the first and second sockets SCK1 and SCK2 may be spaced apart from each other with the memory controller socket SCK_CT interposed therebetween. In other words, when viewed on the top surface of the printed circuit board PCB, the memory controller socket SCK_CT may be located at a middle region of the printed circuit board PCB, and the first and second sockets SCK1 and SCK2 may be located at left and right side regions, respectively, of the printed circuit board PCB.

In some example embodiments, the printed circuit board PCB may include signal lines, which are used to electrically connect the sockets (e.g., SCK_CT, SCK1 and SCK2, and so forth) to each other. The signal lines may be included in a metal layer ML of the printed circuit board PCB. Although the metal layer ML is illustrated to be a single-layered structure, the inventive concepts is not limited thereto. The metal layer ML may be a multi-layered structure including a plurality of layers.

In the afore-described example embodiments described with reference to FIGS. 1 to 7, the signal lines included in the printed circuit board PCB may be elongated in a specific section to reduce the influence of a reflection signal. Hereinafter, the signal lines provided in the metal layer will be described in more detail with reference to the accompanying drawings.

Figure 9A:
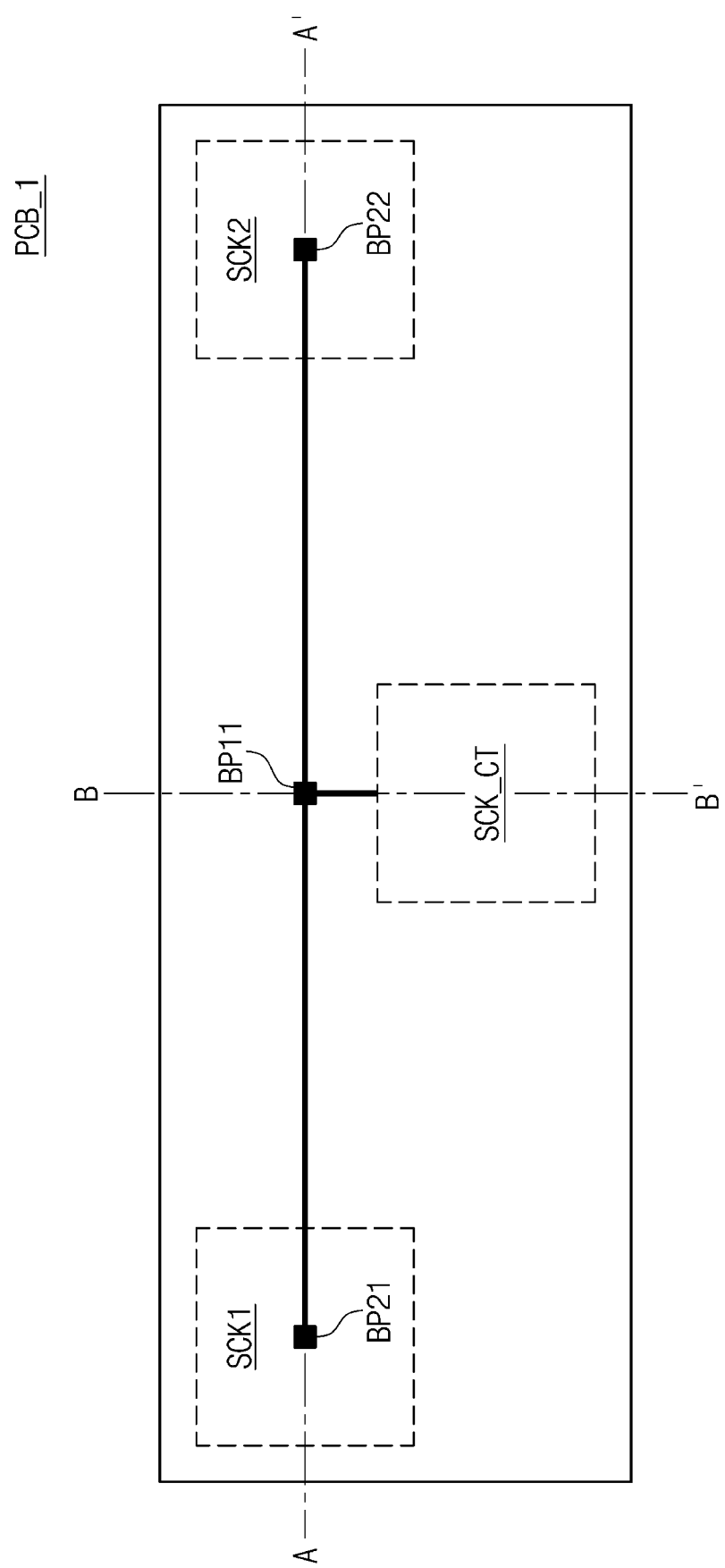
FIGS. 9A to 9C are diagrams illustrating an example of a printed circuit board of FIG. 7.
Figure 9B:
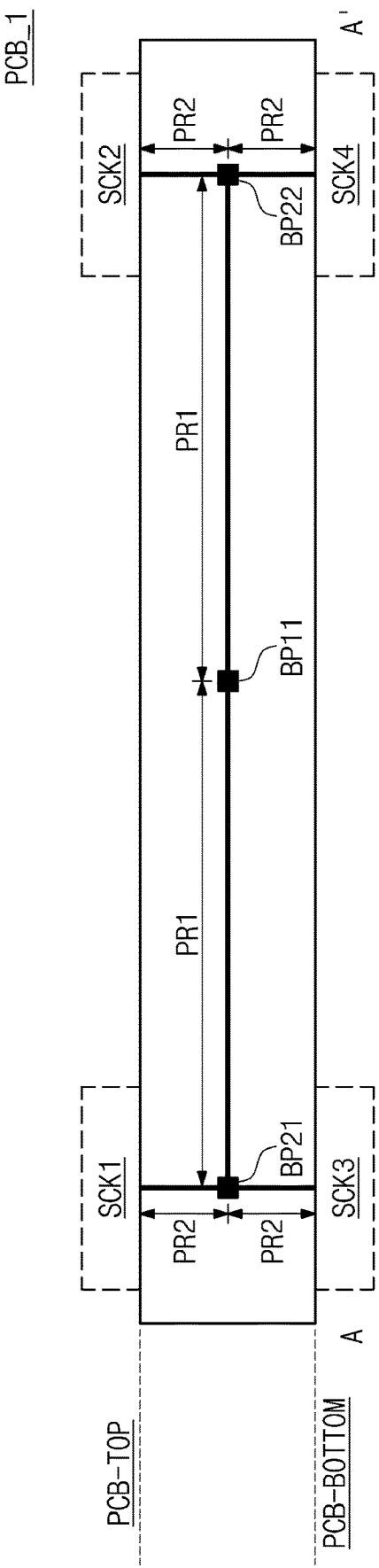
Figure 9C:
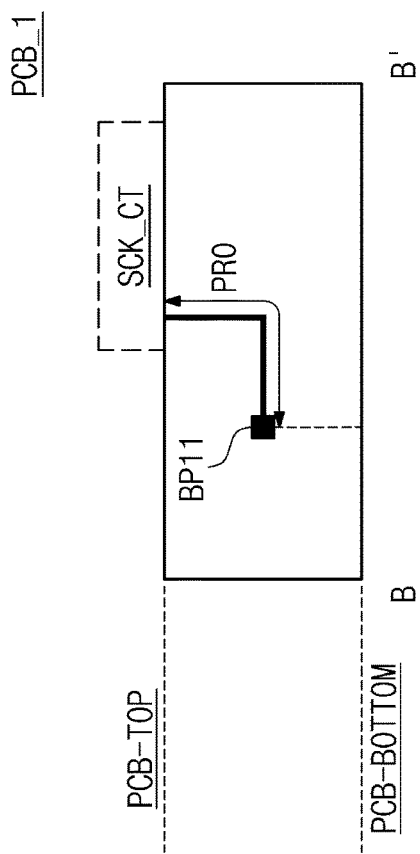

FIGS. 9A to 9C are diagrams illustrating an example of the printed circuit board of FIG. 8. FIG. 9A is a top plan view illustrating a first printed circuit board PCB_1. FIG. 9B is a sectional view of the first printed circuit board PCB_1, taken along line A-A' of FIG. 9A. FIG. 9C is a sectional view of the first printed circuit board PCB_1, taken along line B-B' of FIG. 9A. For convenience in illustration, some example embodiments of the inventive concepts will be described with reference to the single signal line SL illustrated in FIGS. 9A to 9C. However, the inventive concepts are not limited thereto, and in certain example embodiments, the printed circuit board may further include a plurality of additional signal lines.

Referring to FIGS. 9A to 9C, the first printed circuit board PCB_1 may include the memory controller socket SCK_CT and first to fourth sockets SCK1-SCK4. For example, as shown in FIG. 9B, the memory controller socket SCK_CT and the first and second sockets SCK1 and SCK2 may be provided on a top surface PCB_TOP of the first printed circuit board PCB_1, and the third and fourth sockets SCK3 and SCK4 may be provided on a bottom surface PCB_BOTTOM of the first printed circuit board PCB_1. In some example embodiments, the third socket SCK3 may be provided to face the first socket SCK1 with the first printed circuit board PCB_1 interposed therebetween, and the fourth socket SCK4 may be provided to face the second socket SCK2 with the first printed circuit board PCB_1 interposed therebetween.

The memory controller socket SCK_CT may be a region, on which the memory controller described with reference to FIGS. 1 to 7 is mounted. Each of the first and second sockets SCK1 and SCK2 may be a region, on which a non-volatile memory device is mounted. In other words, each of the memory controller and the non-volatile memory devices may be mounted on a corresponding one of the sockets and may communicate with each other through the signal line SL of the printed circuit board PCB.

The printed circuit board PCB may include the signal line SL. The signal line SL may be configured to serve as a signal transmission path between the memory controller and the non-volatile memory devices. In other words, the signal line SL may be configured to electrically connect the first and second sockets SCK1 and SCK2 to the memory controller socket SCK_CT. For example, the signal line SL may be formed in a metal or wiring layer of the first printed circuit board PCB_1.

For example, similar to the previously-described structure, the signal line SL may branch out into at least two line segments at the branching points BP11, BP21, and BP22, in a direction away from the memory controller socket SCK_CT, and in this case, the segmented signal lines of the signal line SL may be used to electrically connect the first and second sockets SCK1 and SCK2 and the memory controller socket SCK_CT to each other. For example, the signal line from the memory controller socket SCK_CT to the branching point BP11 may be included in the zeroth section PR0. The signal lines from the branching point BP11 to the branching points BP21 and BP22 may be included in the first section PR1. The signal lines from each of the branching points BP21 and BP22 to a corresponding one of the first to fourth sockets SCK1-SCK4 may be included in the second section PR2.

In some example embodiments, the branching points BP11, BP21, and BP22 may be positioned at regions associated with the memory controller socket SCK_CT, and the first to fourth sockets SCK1-SCK4. For example, the branching point BP11 may be positioned at a region that is physically adjacent to the memory controller socket SCK_CT. The branching point BP21 may be positioned between the first and third sockets SCK1 and SCK3 and may be connected to the first and third sockets SCK1 and SCK3 through via contacts. The branching point BP22 may be positioned between the second and fourth sockets SCK2 and SCK4 and may be connected to the second and fourth sockets SCK2 and SCK4 through via contacts.

In certain example embodiments, the branching point BP11 may be spaced apart from the memory controller socket SCK_CT by a first distance in a horizontal direction. Each of the branching points BP21 and BP22 may be spaced apart from the branching point BP11 by a second distance in the horizontal direction. Here, the second distance may be longer than the first distance. The horizontal direction may be a direction that is parallel to the top or bottom surface of the printed circuit board PCB. In certain example embodiments, the horizontal direction may be parallel to one of sides of the printed circuit board PCB or may be a diagonal direction, which is at an angle to the sides of the printed circuit board PCB but is parallel to the top surface of the printed circuit board PCB.

The branching points BP21 and BP22 may be spaced apart from the sockets SCK1-SCK4 by a specific distance in the vertical direction. Here, the vertical direction may be a direction that is perpendicular or normal to the top or bottom surface of the printed circuit board PCB. For example, the vertical direction may be an extension direction of the via contact.

The second distance may be determined to prevent or suppress non-volatile memory devices, which are mounted on the first and third sockets SCK1 and SCK3, and other non-volatile memory devices, which are mounted on the second and fourth sockets SCK2 and SCK4, from being mutually affected by reflection signals therebetween.

Similar to the previously-described structure, a length of the signal line in the second section PR2 may be increased to reduce the interference phenomenon between the non-volatile memory devices caused by the reflection signals therebetween. For example, as shown in FIG. 9A, the branching point BP11 may be formed at a position adjacent to the memory controller socket SCK_CT, and the branching points BP21 and BP22 may be respectively formed at positions adjacent to the first to fourth sockets SCK1-SCK4.

As a more detailed example, the memory controller socket SCK_CT and the branching point BP11 may be spaced apart from each other by a first length, each of the branching points BP21 and BP22 may be spaced apart from a corresponding one of the first to fourth sockets SCK1-SCK4 by a second length, and the branching point BP11 may be spaced apart from each of the branching points BP21 and BP22 by a third length. Here, the third length may be longer than the first or second length.

In the case where, as described above, the branching points are formed in the first printed circuit board PCB_1, it may be possible to realize the storage device 100 having the technical effects described with reference to FIGS. 1 to 6.

Figure 10A:
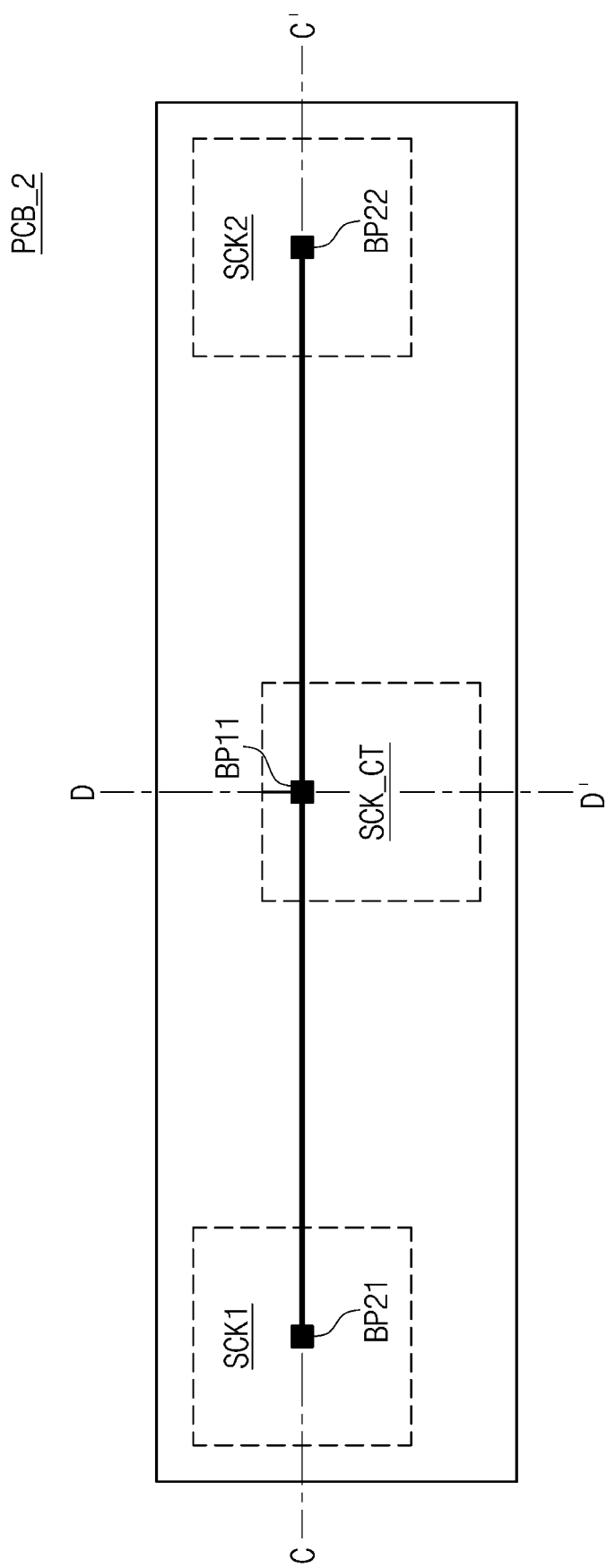
FIGS. 10A to 10C are diagrams illustrating an example of the printed circuit board of FIG. 7.
Figure 10B:
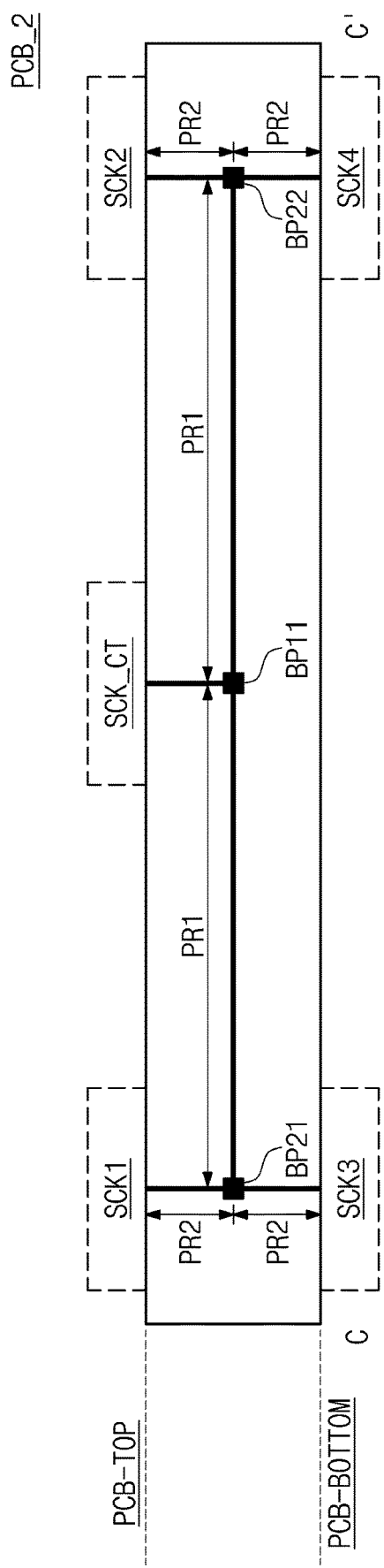
Figure 10C:
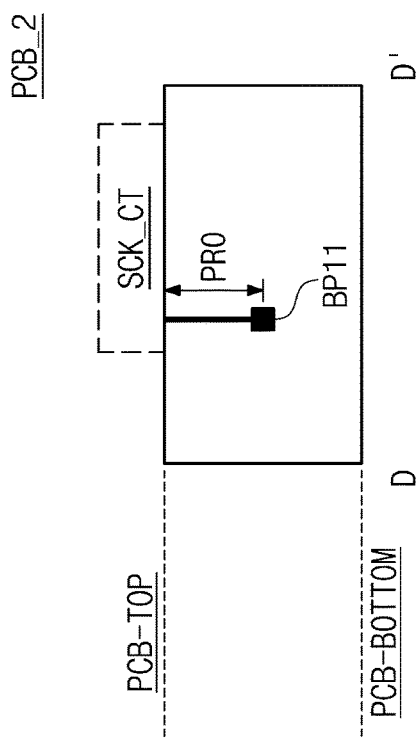

FIGS. 10A to 10C are diagrams illustrating an example of the printed circuit board of FIG. 7. FIG. 10A is a top plan view illustrating a top surface of a second printed circuit board PCB_2. FIG. 10B is a sectional view of the second printed circuit board PCB_2, taken along line C-C' of FIG. 10A. FIG. 10C is a sectional view of the second printed circuit board PCB_2, taken along line D-D' of FIG. 10A. For concise description, a previously described element may be identified by the reference number without repeating an overlapping description thereof.

Referring to FIGS. 10A to 10C, the second printed circuit board PCB_2 may include the memory controller socket SCK_CT and the first to fourth sockets SCK1-SCK4. Unlike the first printed circuit board PCB_1 of FIGS. 9A to 9C, the branching point BP11 in the second printed circuit board PCB_2 of FIGS. 10A to 10C may be provided below the memory controller socket SCK_CT. For example, as shown in FIG. 9C, the memory controller socket SCK_CT and the branching point BP11 may be directly connected to each other through a via contact. Other elements may be configured to have substantially the same features as those in the previously described embodiments, and thus, a detailed description thereof will be omitted.

Figure 11A:
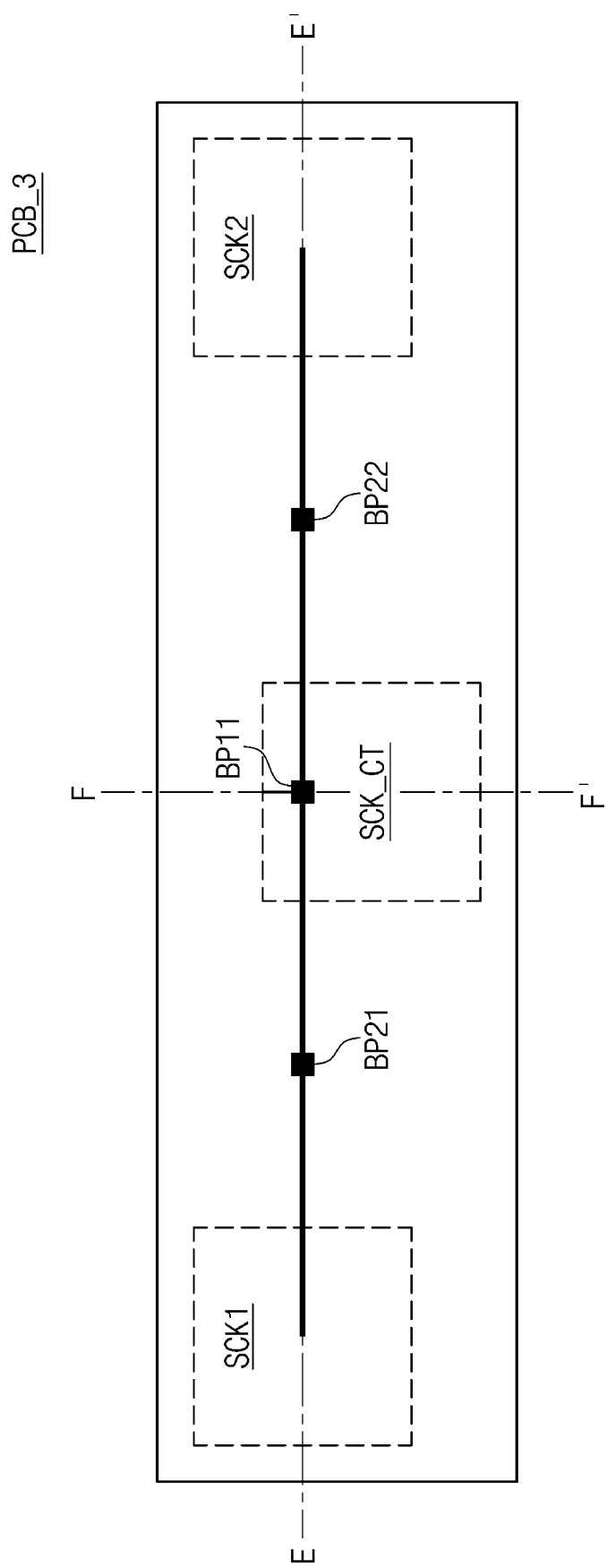
FIGS. 11A and 11B are diagrams illustrating an example of the printed circuit board of FIG. 8.
Figure 11B:
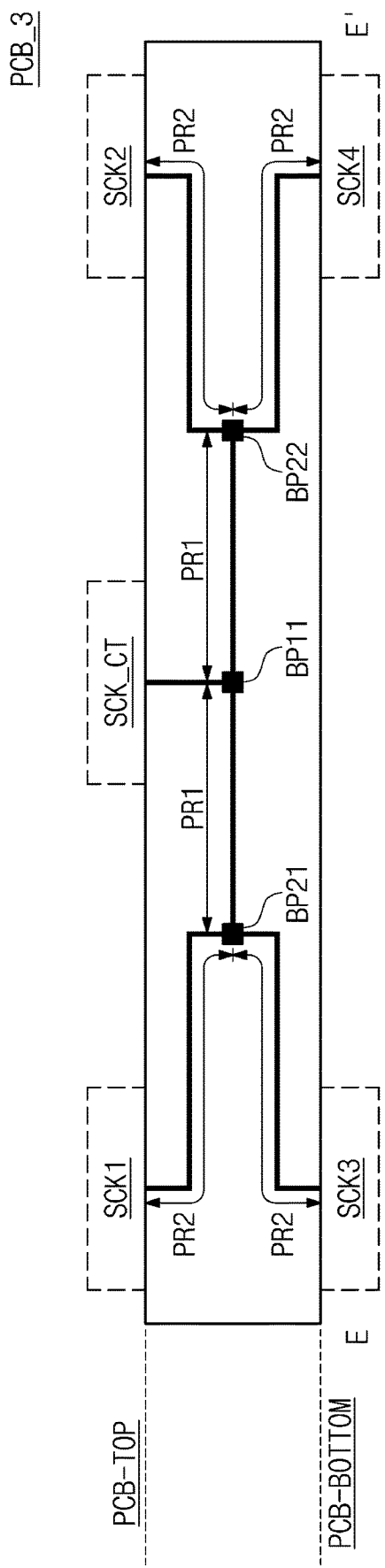

FIGS. 11A and 11B are diagrams illustrating an example of the printed circuit board of FIG. 8. FIG. 11A is a top plan view illustrating a top surface of a third printed circuit board PCB_3. FIG. 11B is a sectional view of the third printed circuit board PCB_3, taken along line E-E' of FIG. 11A. The sectional view of the third printed circuit board PCB_3 taken along line F-F' of FIG. 11A is substantially similar to the sectional view of FIG. 10C, and thus, it is omitted.

Referring to FIGS. 11A and 11B, the third printed circuit board PCB_3 may include the memory controller socket SCK_CT and the first to fourth sockets SCK1-SCK4. Unlike the first printed circuit board PCB_1 of FIGS. 9A to 9C or the second printed circuit board PCB_2 of FIGS. 10A to 10C, the branching points BP21 and BP22 in the third printed circuit board PCB_3 of FIGS. 11A and 11B may be formed at regions, which are spaced apart from the first to fourth sockets SCK1-SCK4 when viewed in a plan view.

For example, as shown in FIGS. 10A and 10B, the branching point BP21 may be formed at a region between the memory controller socket SCK_CT and the first socket SCK1. The branching point BP22 may be formed at a region between the memory controller socket SCK_CT and the second socket SCK2.

Since, as shown in FIGS. 11A and 11B, the branching points BP21 and BP22 are respectively formed at the regions between the memory controller socket SCK_CT and the first and second sockets SCK1 and SCK2, thereby the length of the second section PR2 may be increased. In other words, in the case where the branching points BP21 and BP22 are formed in the manner shown in FIGS. 10A and 10B, it may be possible to realize the embodiments described with reference to FIG. 4.

In other words, in the case where the branching points BP21 and BP22 are formed as shown in FIGS. 10A and 10B, it may be possible to reduce the interference phenomenon between non-volatile memory devices to be mounted on the first and third sockets SCK1 and SCK3 and between other non-volatile memory devices to be mounted on the second and fourth sockets SCK2 and SCK4, which may be caused by reflection signals.

Some examples of the printed circuit boards (e.g., PCB_1, PCB_2, and PCB_3) have been described with reference to FIGS. 9A to 9C, 10A to 10C, 11A, and 11B, but the inventive concepts are not limited to these examples. Furthermore, in FIGS. 9A to 9C, 10A to 10C, 11A, and 11B, the printed circuit boards PCB_1, PCB_2, and PCB_3 are schematically illustrated to provide better understanding of the inventive concepts and to reduce complexity in the drawings. In other words, the signal lines may be realized in a similar manner in various other layers of the printed circuit board, without departing from the spirit of the inventive concepts. Furthermore, the memory controller socket SCK_CT and each of the sockets SCK1-SCK4 may be connected to each other through other signal lines.

In addition, FIGS. 9A to 9C, 10A to 10C, 11A, and 11B illustrate examples of the printed circuit board in which one controller socket and four sockets are provided, but the inventive concepts are not limited thereto. The storage device may be configured to include a plurality of non-volatile memory devices, and the printed circuit board of the storage device may further include a plurality of sockets, each of which is used to mount a corresponding one of the non-volatile memory devices.

Figure 12A:
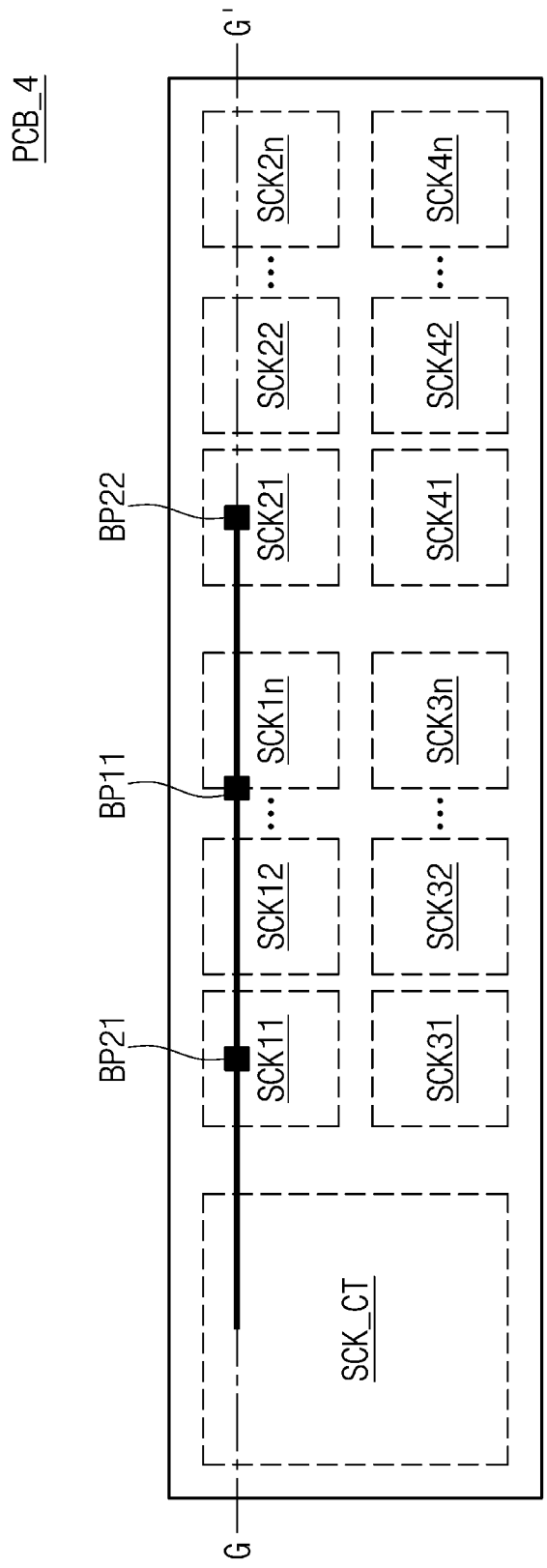
FIGS. 12A and 12B are diagrams illustrating an example of a printed circuit board according to an example embodiment of the inventive concepts.
Figure 12B:
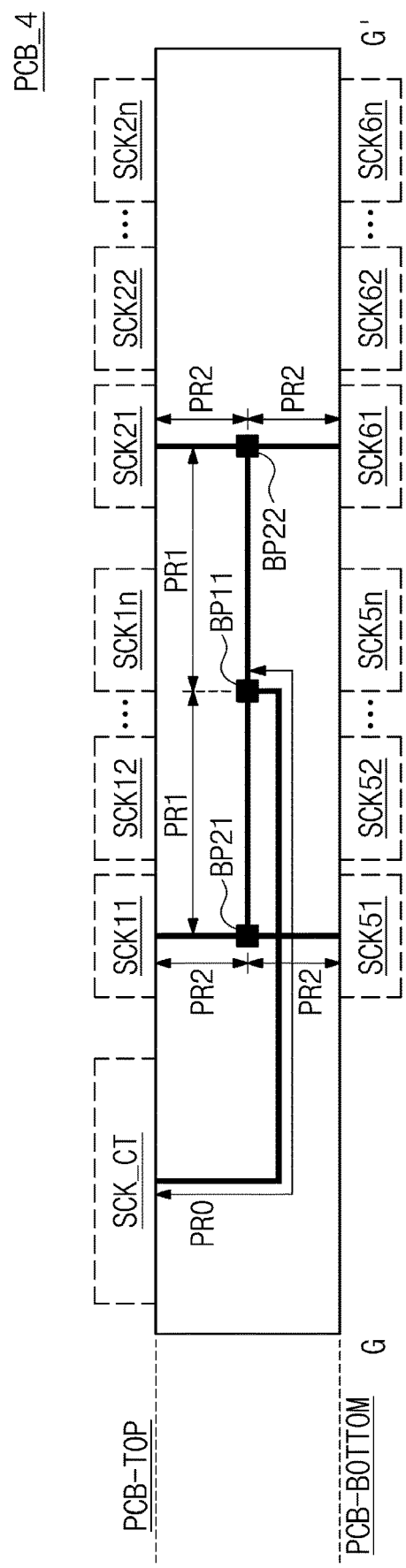

FIGS. 12A and 12B are diagrams illustrating an example of a printed circuit board according to an example embodiment of the inventive concepts. FIG. 12A is a plan view illustrating a top surface of a fourth printed circuit board PCB_4 according to an example embodiment of the inventive concepts, and FIG. 12B is a sectional view of the fourth printed circuit board PCB_4, taken along line G-G' of FIG. 12A.

A single signal line SL, which is electrically connected to some of a plurality of sockets SCK11-SCK4$n$, is exemplarily illustrated to reduce complexity in the drawings and to provide better understanding of example embodiments of the inventive concepts. However, the inventive concepts are not limited thereto, and in certain embodiments, other sockets may also be electrically connected to other signal lines. Hereinafter, a printed circuit board, which can be used to realize, for example, the storage device 300 of FIG. 6, will be described with reference to FIGS. 12A and 12B.

Referring to FIGS. 12A and 12B, the fourth printed circuit board PCB_4 may include the memory controller socket SCK_CT and the plurality of sockets SCK11-SCK4$n$. Unlike the printed circuit boards described with reference to FIGS. 8, 9A to 9C, 10A to 10C, 11A, and 11B, the memory controller socket SCK_CT of FIGS. 12A and 12B may be placed at a side region of the fourth printed circuit board PCB_4. In the previous embodiments described with reference to FIGS. 8, 9A to 9C, 10A to 10C, 11A, and 11B, the memory controller socket SCK_CT may be positioned at a middle region of the printed circuit board, and the sockets SCK1 and SCK2 may be positioned at two opposite side regions of the memory controller socket SCK_CT. By contrast, as shown in FIGS. 12A and 12B, the memory controller socket SCK_CT may be placed at the side region of the fourth printed circuit board PCB_4, and the plurality of sockets SCK11-SCK4$n$ may be placed at the remaining region.

The memory controller socket SCK_CT may be electrically connected to the first branching point BP11. The first branching point BP11 may be spaced apart from the memory controller socket SCK_CT by a predetermined distance. The first branching point BP11 may be electrically connected to each of the second and third branching points BP21 and BP22.

The second branching point BP21 may be electrically connected to each of the sockets SCK11 and SCK51, and the third branching point BP22 may be electrically connected to each of the sockets SCK21 and SCK61. Here, as shown in FIG. 12B, a length of the zeroth section PR0 may be longer than that of the first section PR1. However, as described with reference to FIG. 6, even when the length of the zeroth section PR0 is longer than the length of the first section PR1, the interference between the non-volatile memory devices caused by reflection signals therebetween may be reduced if the length of the first section PR1 is longer than a specific length.

For example, the sockets SCK11, SCK21, SCK51, and SCK61 may be electrically connected to the memory controller socket SCK_CT through a common channel (i.e., a single interconnection structure). Here, the sockets SCK11 and SCK51 may be provided to face each other with the fourth printed circuit board PCB_4 interposed therebetween, and the sockets SCK21 and SCK61 may be provided to face each other with the fourth printed circuit board PCB_4 interposed therebetween. In other words, the sockets SCK11 and SCK21 may be provided on the top surface PCB_TOP of the printed circuit board, and the sockets SCK51 and SCK61 may be provided on the bottom surface PCB_BOTTOM of the printed circuit board.

Here, the sockets SCK11 and SCK21 provided on the top surface PCB_TOP may not be adjacent to each other. For example, at least one other sockets (e.g., SCK12-SCK1$n$) may be located between the sockets SCK11 and SCK21, which are connected to the common channel (i.e., the single interconnection structure), and such other sockets (e.g., SCK12-SCK1$n$) may be electrically connected to the memory controller socket SCK_CT through additional signal lines. The sockets SCK51 and SCK61 provided on the bottom surface PCB_BOTTOM may not be adjacent to each other. For example, at least one other sockets (e.g., SCK52-SCK5$n$) may be located between the sockets SCK51 and SCK61, which are connected to the single interconnection structure, and such other sockets (e.g., SCK52-SCK5$n$) may be electrically connected to the memory controller socket SCK_CT through additional signal lines.

In some example embodiments, in a conventional storage device, adjacent sockets may be electrically connected to a controller socket through a single interconnection structure. In this case, branching points may be formed near the adjacent sockets, and thus, a signal line in the first section may have a relatively short length. By contrast, according to an example embodiment of the inventive concepts, the non-adjacent sockets (e.g., SCK11 and SCK21) may be connected to the memory controller socket SCK_CT through the single interconnection structure, and thus, the signal line in the first section PR1 may be provided to have a relatively long length. Accordingly, it may be possible to reduce the interference phenomenon between the non-volatile memory devices mounted on the sockets, which may be caused by reflection signals therebetween.

The fourth printed circuit board PCB_4 shown in FIGS. 12A and 12B is just an example of the printed circuit board according to some example embodiments of the inventive concepts, but the inventive concepts are not limited thereto. The position of each of the branching points BP11, BP21, and BP22 in the fourth printed circuit board PCB_4 may be variously changed, if within an allowable range under the spirit of the inventive concepts.

For example, the first branching point BP11 may be located at the region for the socket SCK11, the region for the socket SCK21, or any other region, but the signal line in the first section PR1 may be provided in such a way that the first section PR1 has a specific length. Here, the specific length may be determined to allow the reflection signal to have an amplitude lower than a specific level.

Figure 13A:
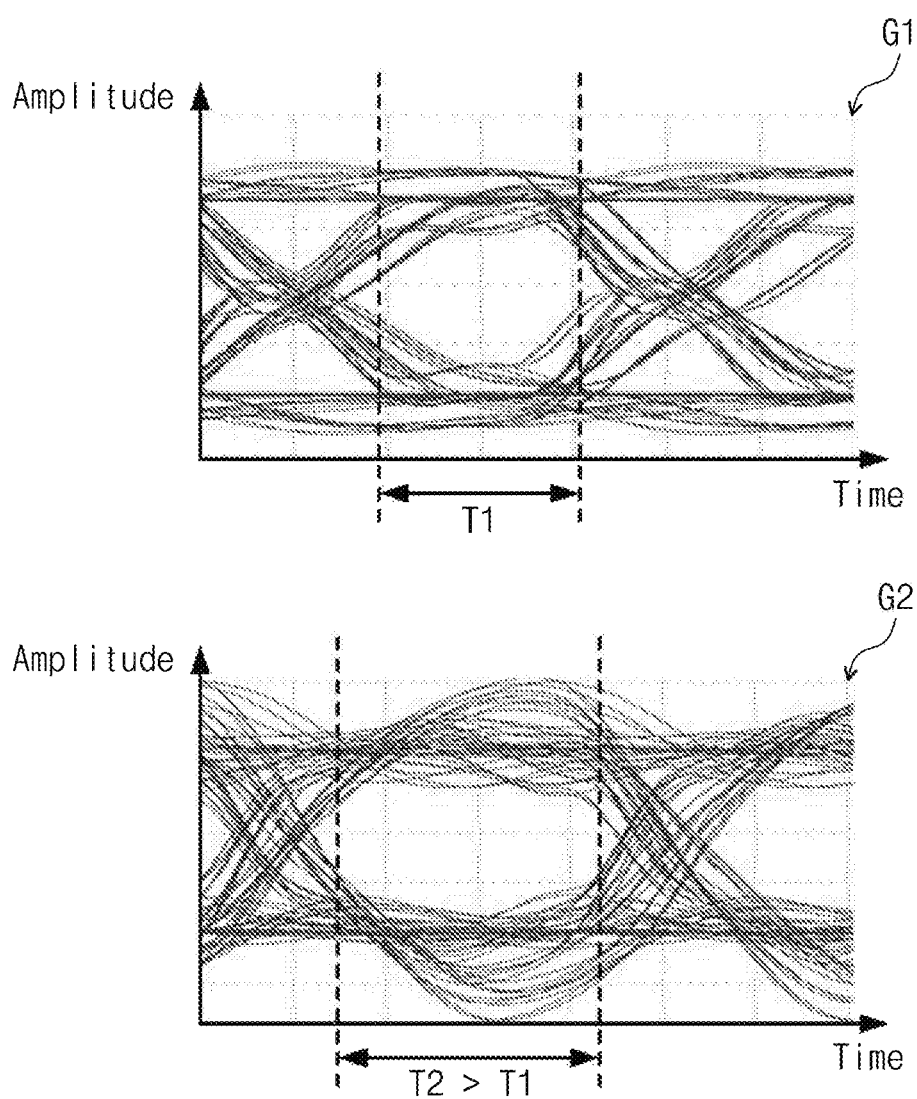
FIGS. 13A and 13B are timing diagrams illustrating a reflection signal diminishing effect, according to an example embodiment of the inventive concepts.
Figure 13B:
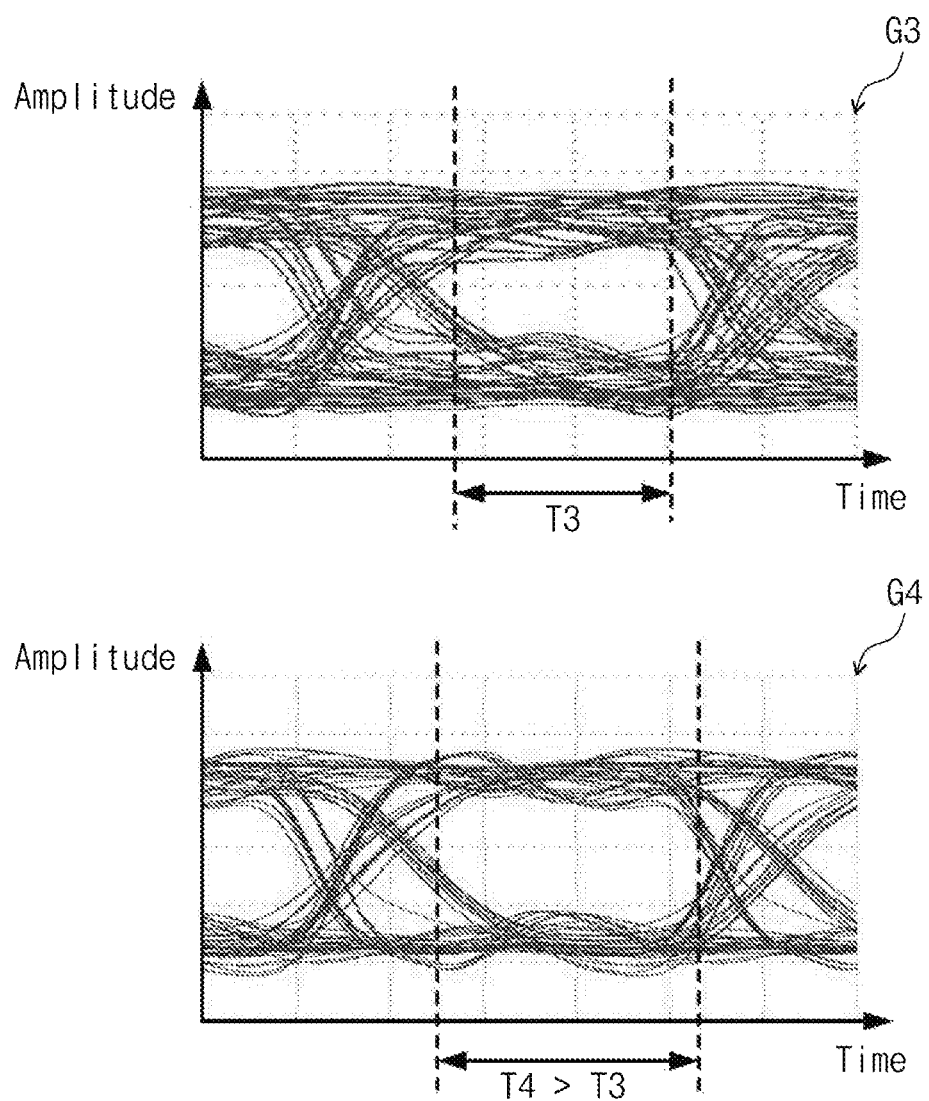

FIGS. 13A and 13B are timing diagrams illustrating a reflection signal diminishing effect, according to an example embodiment of the inventive concepts. FIG. 13A shows a wave form of an input signal at a memory controller during a reading operation (i.e., of transmitting a signal from a non-volatile memory device to the memory controller), whereas FIG. 13B shows a wave form of an input signal at a non-volatile memory device during a write operation (i.e., of transmitting a signal from the memory controller to the non-volatile memory device). In the timing diagrams of FIGS. 13A and 13B, the horizontal axes represent time and the vertical axes represent amplitudes of signals.

Referring to FIG. 13A, a first graph G1 shows a wave form of a read signal in the conventional structure of the storage device, and a second graph G2 shows a wave form of a read signal in a proposed structure of the storage device according to the inventive concepts. For example, the read signal may be a signal that is transmitted through a signal line during the reading operation of the storage device. In other words, the wave form of the read signal may be a wave form of a signal to be received by the memory controller.

As shown in FIG. 13A, a margin for a read signal in the conventional structure of the storage device may be a first time T1, owing to the interference phenomenon caused by the reflection signal, whereas a margin for a read signal in the proposed structure of the storage device according to the inventive concepts may be a second time T2 that is longer than the first time T1. That is, by increasing a length of a channel or signal line in a specific section, it may be possible to reduce an undesirable interference phenomenon caused by reflection signals from other non-volatile memory devices and thereby to increase a margin for the read signal.

Referring to FIG. 13B, a third graph G3 shows a wave form of a write signal in the conventional structure of the storage device, and a fourth graph G4 shows a wave form of a write signal in the proposed structure of the storage device according to the inventive concepts. For example, the write signal may be a signal that is transmitted through a signal line during the write operation of the storage device. In other words, the wave form of the write signal may be a wave form of a signal to be received by the non-volatile memory device.

As shown in FIG. 13B, a margin for a write signal in the conventional structure of the storage device may be a third time T3, owing to the interference phenomenon caused by the reflection signal. As an example, in the case where the write signal has a wave form shaped like the third graph G3, owing to the reflection signal, an input signal may be distorted, and thus, a change in its amplitude may not be sufficiently large. In this case, there is a difficulty in normally determining a signal that is input to the non-volatile memory device.

By contrast, in the proposed structure of the storage device according to the inventive concepts, a margin for the write signal may be a fourth time T4 that is longer than the third time T3. Furthermore, since the interference phenomenon caused by the reflection signal is reduced, a change in amplitude of a signal may be sufficiently large. That is, it may be possible to reliably sense a signal to be input to a non-volatile memory device.

In other words, according to an example embodiment of the inventive concepts, a length of a channel or signal line in a specific section may be adjusted or increased to reduce the interference phenomenon caused by reflection signals from other non-volatile memory devices, and this may make it possible to improve reliability of a storage device.

Figure 14A:
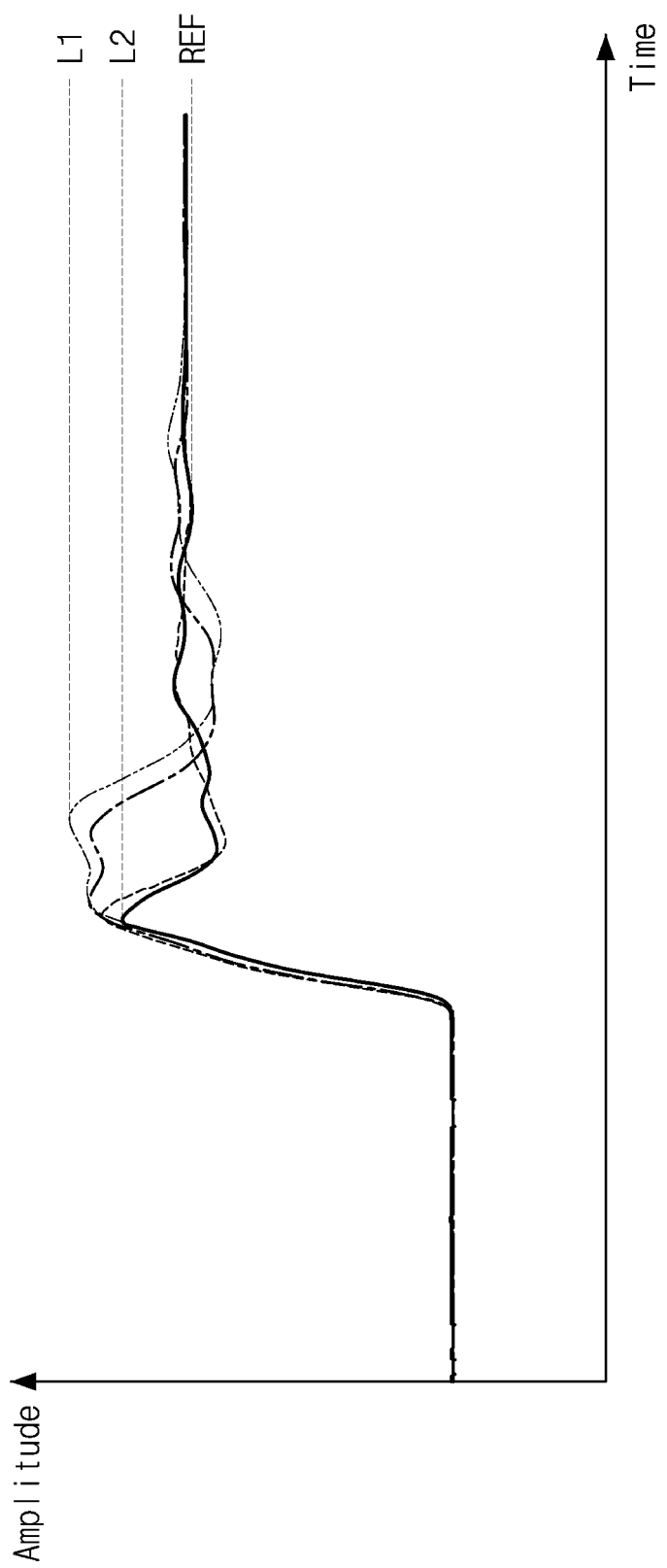
FIGS. 14A and 14B are timing diagrams illustrating a reflection signal diminishing effect, according to an example embodiment of the inventive concepts.
Figure 14B:
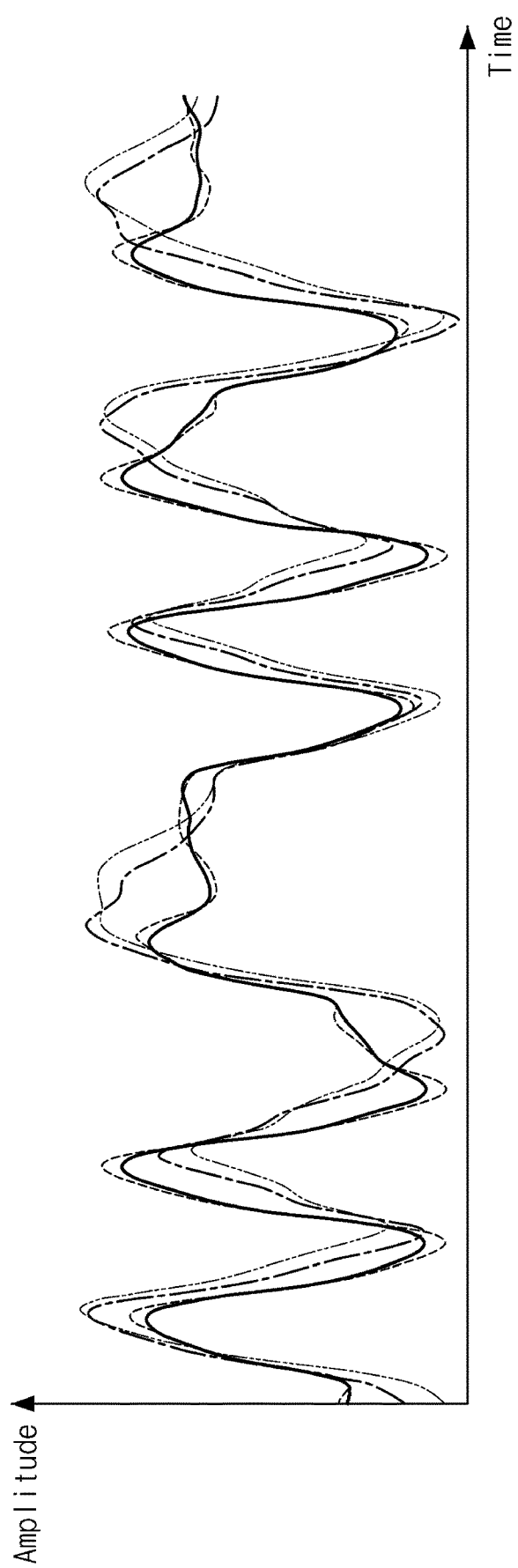

FIGS. 14A and 14B are timing diagrams illustrating a reflection signal diminishing effect, according to an example embodiment of the inventive concepts. In detail, FIG. 14A is a timing diagram showing how the waveform of a signal entering the first non-volatile memory device NVM1 changes with lengths of the zeroth and first sections PR0 and PR1, when an input signal is a step-pulse, i.e., an impulse signal having an increasing amplitude from a low state to a high state. FIG. 14B is a timing diagram showing how the waveform of a signal entering the first non-volatile memory device NVM1 changes with lengths of the zeroth and first sections PR0 and PR1, when an input signal is a random-pulse. The lengths of the zeroth and first sections PR0 and PR1 for each curve in FIGS. 14A and 14B are summarized in Table 1.

TABLE 1

| Line type | Length of zeroth section | Length of first section |
|---|---|---|
| Solid line | 10 mm | 90 mm |
| Dash line | 20 mm | 80 mm |
| Dash-single dotted line | 80 mm | 20 mm |
| Dash-double dotted line | 90 mm | 10 mm |

In FIGS. 14A and 14B, the solid and dash lines represent signals measured from a proposed structure of the storage device according to the inventive concepts, and the dash-single dotted line and the dash-double dotted line represent signals measured from the conventional structure of the storage device. In Table 1, some numerical values are shown as an example, but the inventive concepts are not limited thereto. As shown in FIG. 14A, the highest signal amplitudes in the proposed structure of the storage device according to the inventive concepts were low and were quickly converged to the reference value, compared with the conventional structure. This means that the signal distortion issue caused by the reflection signal was suppressed by the proposed structure. For instance, as shown in FIG. 14A, the highest signal amplitude was a first level L in the dash-double dotted line for the conventional structure and was a second level L2, which was lower than the first level L1, in the solid line for the proposed structure according to the inventive concepts. That is, a difference between the solid line for the proposed structure according to the inventive concepts and a reference level REF was smaller than that between the dash-double dotted line for the conventional structure and the reference level REF. This means that, in the proposed structure of the storage device according to the inventive concepts, an undesirable effect caused by a reflection signal can be more effectively reduced, compared with the conventional structure.

Referring to FIG. 14B, the solid or dash line from the proposed structure of the storage device according to the inventive concepts had a decreased signal distortion, compared with the dash-single dotted line or the dash-double dotted line from the conventional structure, similar to that in FIG. 14A. In the proposed structure of the storage device according to the inventive concepts, a length of a signal line in a specific section is increased to attenuate or delay reflection signals between non-volatile memory devices, as described above. Thus, it may be possible to suppress a signal distortion caused by the reflection signal and thereby to improve reliability of a storage device.

Figure 15:
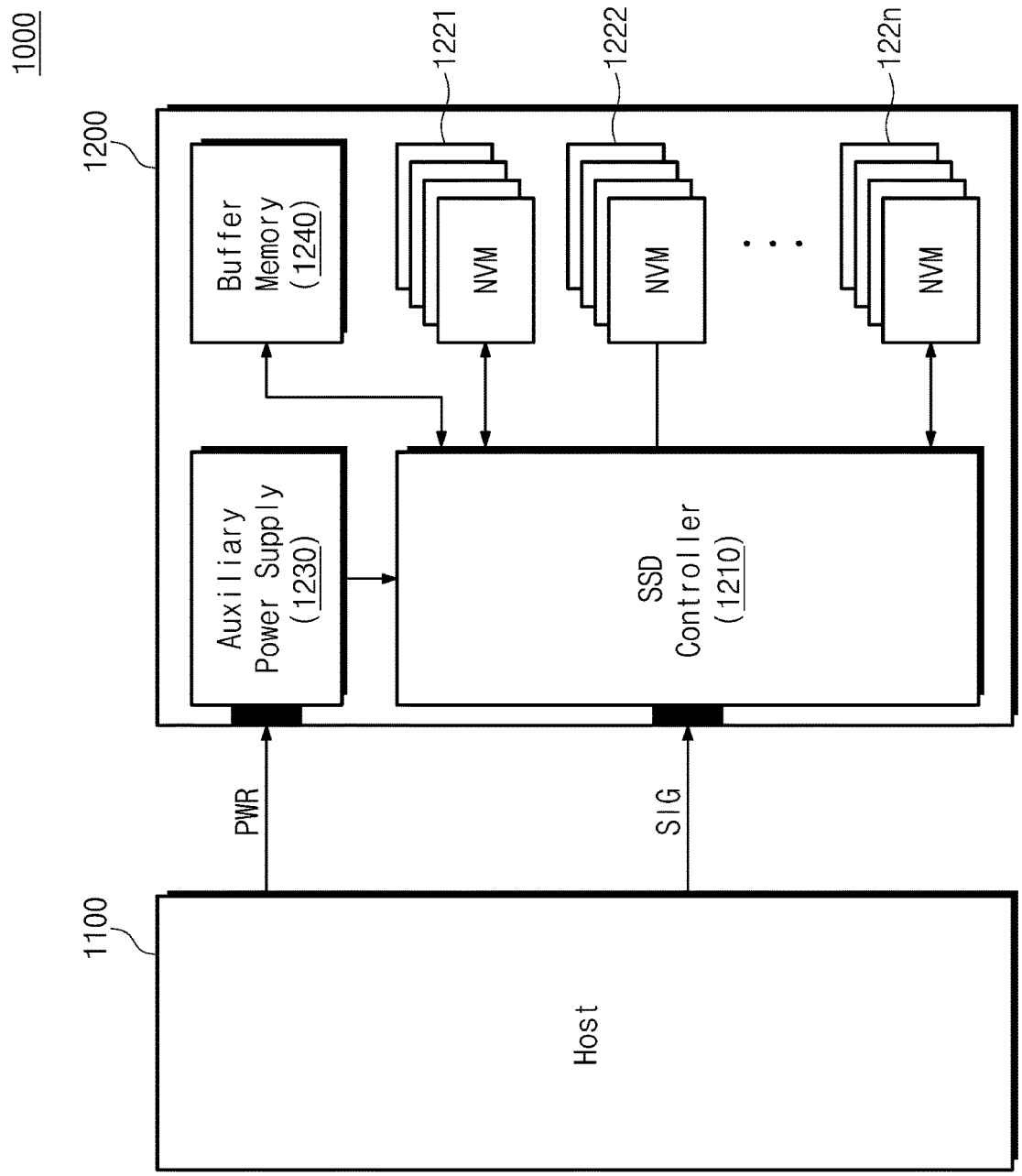
FIG. 15 is a block diagram illustrating an SSD system, in which a storage device according to an example embodiment of the inventive concepts is used.

FIG. 15 is a block diagram illustrating a solid state drive (SSD) system, in which a storage device according to an example embodiment of the inventive concepts is used.

Referring to FIG. 15, an SSD system 1000 may include a host 1100 and an SSD 1200.

The SSD 1200 may exchange a signal SIG with the host 1100 through a signal connector and may supplied with power PWR through a power connector. The SSD 1200 may include an SSD memory controller 1210, a plurality of FLASH memories 1221-122 n, an auxiliary power supply 1230, and a buffer memory 1240.

The SSD memory controller 1210 may control the plurality of FLASH memories 1221-122n in response to the signal SIG provided from the host 1100. The plurality of FLASH memories 1221-122n may operate under control of the SSD memory controller 1210. The auxiliary power supply 1230 may be connected to the host 1100 through a power connector 1002. For example, each of the FLASH memories 1221-122n may include the memory blocks or the memory structures described with reference to FIGS. 1 to 17. The auxiliary power supply 1230 may be charged by the power PWR from the host 1100. In the case where there is a difficulty associated with the supply of the power PWR from the host 1100, the auxiliary power supply 1230 may be used to supply electric power to the SSD 1200.

In some example embodiments, the SSD 1200 may be configured to have the topology described with reference to FIGS. 1 to 14B. For example, various elements constituting the SSD 1200 may be mounted on a printed circuit board and may be electrically connected to each other through various signal lines, which are provided in the printed circuit board. Here, as described above, at least one of the signal lines between the SSD memory controller 1210 and the plurality of non-volatile memory devices 1221-122n may be configured to have an increased length in a specific section, and this may make it possible to suppress an undesirable interference phenomenon between the non-volatile memory devices, which may be caused by reflection signals therebetween.

According to some example embodiments of the inventive concepts, signal lines are provided between a memory controller and non-volatile memory devices. Lengths of the signal lines in a specific section may be increased to suppress an interference phenomenon between the non-volatile memory devices, which is caused by a reflection signal therebetween. Thus, it may be possible to hinder (or, alternatively prevent) signal reliability from being deteriorated by the reflection signal. This may make it possible to improve reliability of a printed circuit board or a storage device including the printed circuit board.

The units and/or devices described above, such as the components of the storage device (e.g., 100) including the memory controller (e.g., 110) and the nonvolatile memory device 120 as well as the sub-components thereof may be implemented using hardware, a combination of hardware and software, or a non-transitory storage medium storing software that is executable to perform the functions of the same.

Hardware may be implemented with various hardware devices, such as integrated circuits (ICs), application specific ICs (ASICs), field programmable gate array (FPGAs), complex programmable logic device (CPLDs), system on chips (SoCs) or processing circuitry such as one or more Central Processing Units (CPUs), one or more controllers, one or more arithmetic logic units (ALUs), one or more digital signal processors (DSPs), one or more microcomputers, or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein.

The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

While example embodiments of the inventive concepts have been particularly shown and described, it will be understood by one of ordinary skill in the art that variations in form and detail may be made therein without departing from the spirit and scope of the attached claims.

What is claimed is:

1. A printed circuit board (PCB) with a top surface and a bottom surface, the PCB comprising:
   a controller socket on the top surface;
   a first socket and a second socket on the top surface;
   a third socket and a fourth socket on the bottom surface facing the first socket and the second socket, respectively; and
   signal lines including at least first to seventh signal lines connecting the controller socket to the first socket, the second socket, the third socket and the fourth socket, the signal lines being connected at branching points including,
   a first branching point electrically connected to the controller socket via the first signal line such that the first branching point is spaced apart from the controller socket by a first distance in a horizontal direction parallel to the top surface,
   a second branching point electrically connected to the first branching point via the second signal line, the first socket via the fourth signal line, and the third socket via the fifth signal line such that the second branching point is spaced apart from the first branching point by a second distance, the second distance being longer than the first distance in the horizontal direction, and
   a third branching point electrically connected to the first branching point via the third signal line, the second socket via the sixth signal line, and the fourth socket via the seventh signal line such that the third branching point is spaced apart from the first branching point by a third distance in the horizontal direction, the third distance being longer than the first distance in the horizontal direction, wherein
   a length of each of the second signal line and the third signal line is longer than a length of each of the fourth signal line, the fifth signal line, the sixth signal line, and the seventh signal line.

2. The printed circuit board of claim 1, wherein a length of each of the second signal line and the third signal line is longer than a length of the first signal line.

3. The printed circuit board of claim 1, wherein
   the length of each of the fourth signal line, the fifth signal line, the sixth signal line, and the seventh signal line is longer than that of the first signal line.

4. The printed circuit board of claim 1, wherein
   the first socket is at a region that is spaced apart from the controller socket in a first lateral direction, and
   the second socket is at a region that is spaced apart from the controller socket in a second lateral direction opposite to the first lateral direction.

5. The printed circuit board of claim 1, wherein
   the second branching point is at a region between the first socket and the third socket, and
   the third branching point is at a region between the second socket and the fourth socket.

6. The printed circuit board of claim 1, further comprising:
   a metal layer including the signal lines and the first branching point, the second branching point and the third branching point associated therewith.

7. A storage device, comprising:
   non-volatile memory devices including a first non-volatile memory device, a second non-volatile memory device, a third non-volatile memory device and a fourth non-volatile memory device;
   a memory controller configured to control the non-volatile memory devices; and
   a plurality of signal lines including,
      a first signal line configured to electrically connect the memory controller to a first branching point,
      a second signal line configured to electrically connect the first branching point to a second branching point, the second signal line being longer than the first signal line,
      a third signal line configured to electrically connect the first branching point to a third branching point, the third signal line being longer than the first signal line, a fourth signal line configured to electrically connect the second branching point to the first non-volatile memory device,
a fifth signal line configured to electrically connect the second branching point to the second non-volatile memory device,
a sixth signal line configured to electrically connect the third branching point to the third non-volatile memory device, and
a seventh signal line configured to electrically connect the third branching point to the fourth non-volatile memory device, wherein
a length of each of the second signal line and the third signal line is longer than a length of each of the fourth signal line, the fifth signal line, the sixth signal line, and the seventh signal line.

8. The storage device of claim 7, wherein the memory controller is configured to provide an input signal the non-volatile memory devices through the plurality of signal lines.

9. The storage device of claim 7, wherein one or more of the third non-volatile memory device and the fourth non-volatile memory device produces a reflection signal when the first non-volatile memory device is activated, and the length of each of the second signal line and the third signal line are set such that the second signal line and the third signal line attenuate the reflection signal below a set level.

10. The storage device of claim 7, wherein the second non-volatile memory device produces a reflection signal when the first non-volatile memory device is activated, and the length of each of the fourth signal line and the fifth signal line are set such that the fourth signal line and the fifth signal line attenuate the reflection signal below a set level.

11. The storage device of claim 7, wherein each of the non-volatile memory devices is activated in response to an associated chip selection signal from the memory controller.

12. The storage device of claim 7, wherein each of the non-volatile memory devices is a multi-chip package.

13. The storage device of claim 7, wherein one or more of the non-volatile memory devices produces a reflection signal, and the length of each of the second signal line and the third signal line are set such that the second signal line and the third signal line retard the reflection signal by a delay time set based on an operation speed of the storage device.

14. A storage device, comprising:
a memory controller;
a plurality of non-volatile memory devices including a first non-volatile memory device, a second non-volatile memory device, a third non-volatile memory device and a fourth non-volatile memory device; and
a printed circuit board including a top surface and a bottom surface, the top surface having the first non-volatile memory device and the second non-volatile memory device mounted thereon, and the bottom surface having the third non-volatile memory device and the fourth non-volatile memory device mounted thereon such that the third non-volatile memory device faces the first non-volatile memory device and the fourth non-volatile memory device faces the third non-volatile memory device, the printed circuit board including signal lines including at least first to seventh signal lines connecting the memory controller to the plurality of non-volatile memory devices, the signal lines being connected at branching points including,
a first branching point electrically connected to the memory controller via the first signal line such that the first branching point is spaced apart from the memory controller by a first distance in a horizontal direction parallel to the top surface,
a second branching point electrically connected to the first branching point via the second signal line, the first non-volatile memory device via at least the fourth signal line, and the third non-volatile memory device via the fifth signal line such that the second branching point is spaced apart from the first branching point by a second distance in the horizontal direction, the second distance being longer than the first distance, and
a third branching point electrically connected to the first branching point via the third signal line, the second non-volatile memory device via the sixth signal line, and the fourth non-volatile memory device via the seventh signal line such that the third branching point is spaced apart from the first branching point by a third distance in the horizontal direction, the third distance being longer than the first distance, wherein
a length of each of the second signal line and the third signal line is longer than a length of each of the fourth signal line, the fifth signal line, the sixth signal line, and the seventh signal line.

15. The storage device of claim 14, wherein
the second branching point is at a region between the first non-volatile memory device and the third non-volatile memory device, and
the third branching point is at a region between the second non-volatile memory device and the fourth non-volatile memory device.

16. The storage device of claim 14, wherein the first branching point is below a region, on which the memory controller is mounted such that the first branching point is electrically connected to the memory controller through a via contact extending in a vertical direction, the vertical direction being perpendicular to the top surface.

17. The storage device of claim 14, wherein
the first non-volatile memory device is mounted on a first region of the top surface, the first region being spaced apart from the memory controller in a first lateral direction, and
the second non-volatile memory device is mounted on a second region of the top surface, the second region being spaced apart from the memory controller in a second lateral direction opposite to the first lateral direction.

18. The storage device of claim 14, wherein
one or more of the non-volatile memory devices produces a reflection signal, and the length of each of the first signal line and the second signal line are set such that the first signal line and the second signal line retard the reflection signal by a delay time, the delay time being set based on an operation speed of the storage device.

* * * * *